(12) United States Patent
Chiang et al.

(10) Patent No.: US 12,310,137 B2
(45) Date of Patent: May 20, 2025

(54) ISOLATION STRUCTURE TO INCREASE IMAGE SENSOR PERFORMANCE

(71) Applicant: Taiwan Semiconductor Manufacturing Company, Ltd., Hsinchu (TW)

(72) Inventors: Yen-Ting Chiang, Tainan (TW); Yen-Yu Chen, Kaohsiung (TW); Wen Hao Chang, Yunlin County (TW); Tzu-Hsuan Hsu, Kaohsiung (TW); Feng-Chi Hung, Chu-Bei (TW); Shyh-Fann Ting, Tainan (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 380 days.

(21) Appl. No.: 17/828,346

(22) Filed: May 31, 2022

(65) Prior Publication Data
US 2023/0317757 A1   Oct. 5, 2023

Related U.S. Application Data

(60) Provisional application No. 63/325,254, filed on Mar. 30, 2022.

(51) Int. Cl.
*H10F 39/00* (2025.01)
*H10F 39/18* (2025.01)

(52) U.S. Cl.
CPC ........ *H10F 39/807* (2025.01); *H10F 39/024* (2025.01); *H10F 39/18* (2025.01); *H10F 39/813* (2025.01)

(58) Field of Classification Search
CPC ...... H10F 39/807; H10F 39/024; H10F 39/18; H10F 39/813
See application file for complete search history.

(56) References Cited

U.S. PATENT DOCUMENTS

| 10,043,841 | B1 * | 8/2018 | Chang | H10F 39/199 |
| 10,622,394 | B2 * | 4/2020 | Wu | H10F 39/8067 |
| 11,375,100 | B2 * | 6/2022 | Kim | H01L 27/14607 |
| 11,652,125 | B2 * | 5/2023 | Lee | H10F 39/014 257/292 |

(Continued)

FOREIGN PATENT DOCUMENTS

CN          215896396 U      2/2022

*Primary Examiner* — Shaun M Campbell
(74) *Attorney, Agent, or Firm* — Eschweiler & Potashnik, LLC

(57) ABSTRACT

Various embodiments of the present disclosure are directed towards an image sensor including a plurality of photodetectors disposed within a substrate. The substrate comprises a front-side surface opposite a back-side surface. An outer isolation structure is disposed in the substrate and laterally surrounds the plurality of photodetectors. The outer isolation structure has a first height. An inner isolation structure is spaced between sidewalls of the outer isolation structure. The inner isolation structure is disposed between adjacent photodetectors in the plurality of photodetectors. The outer isolation structure and the inner isolation structure respectively extend from the back-side surface toward the front-side surface. The inner isolation structure comprises a second height less than the first height.

20 Claims, 18 Drawing Sheets

(56) References Cited

U.S. PATENT DOCUMENTS

| | | |
|---|---|---|
| 2013/0323875 A1 | 12/2013 | Park et al. |
| 2014/0054662 A1* | 2/2014 | Yanagita ............ H01L 27/14612 |
| | | 438/73 |
| 2015/0243694 A1 | 8/2015 | Ihara |
| 2016/0043119 A1* | 2/2016 | Lee ....................... H04N 25/702 |
| | | 257/446 |
| 2017/0140006 A1 | 5/2017 | Yang |
| 2018/0102389 A1* | 4/2018 | Lee ................... H01L 27/14621 |
| 2019/0035829 A1 | 1/2019 | Chang et al. |
| 2019/0043901 A1 | 2/2019 | Honda et al. |
| 2020/0387050 A1 | 12/2020 | Pyo et al. |
| 2021/0043664 A1 | 2/2021 | Chiang et al. |
| 2021/0144321 A1* | 5/2021 | Yamashita ......... H01L 27/14656 |
| 2021/0193703 A1* | 6/2021 | Watanabe ............ H01L 27/1463 |
| 2021/0272987 A1 | 9/2021 | Masagaki |
| 2022/0078364 A1 | 3/2022 | Kim et al. |

\* cited by examiner

ISOLATION STRUCTURE TO INCREASE IMAGE SENSOR PERFORMANCE

REFERENCE TO RELATED APPLICATION

This Application claims the benefit of U.S. Provisional Application number 63/325,254, filed on Mar. 30, 2022, the contents of which are hereby incorporated by reference in their entirety.

BACKGROUND

Many modern-day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
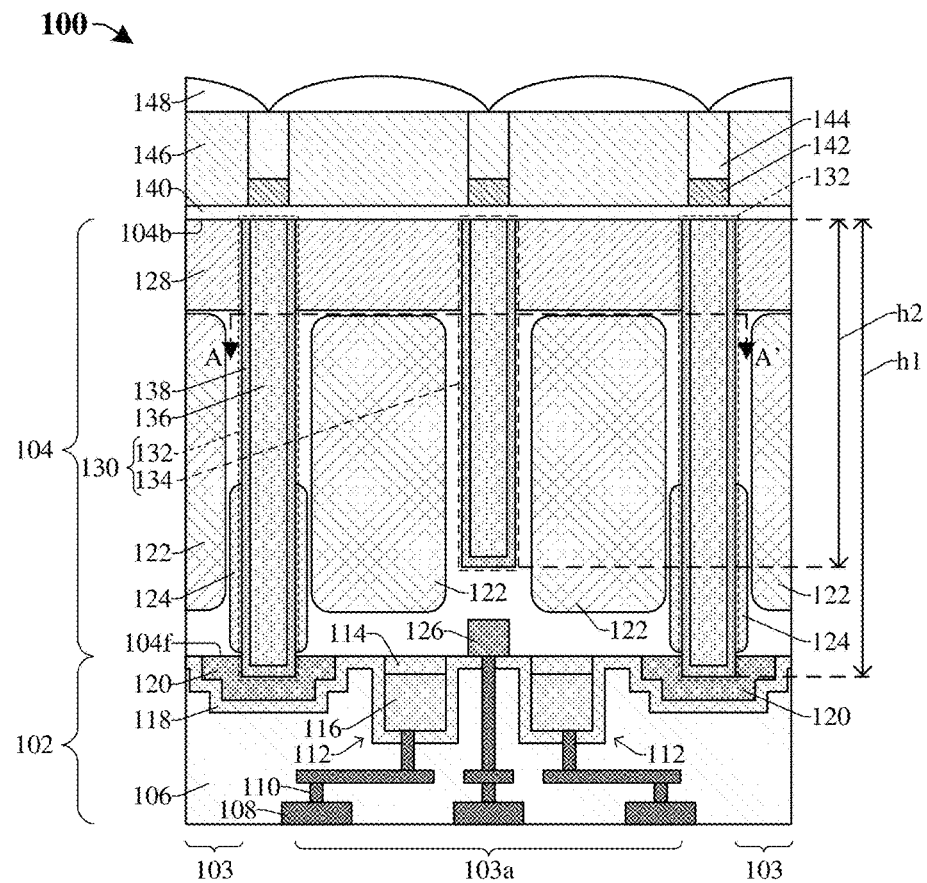
FIG. 1 illustrates a cross-sectional view of some embodiments of an image sensor comprising an isolation structure having an outer isolation structure and an inner isolation structure that have different heights.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor records incident radiation (e.g., visible light) using a photodetector, and facilitates digital readout of the recording with a plurality of pixel devices (e.g., a transfer transistor, a reset transistor, etc.) disposed on a front-side of a substrate. The pixel sensors comprise an array of photodetectors (e.g., a 2×2, 2×4, or 4×4 photodetector pixel sensor). In such pixel sensors, the array of photodetectors is disposed around a floating diffusion node. In order to achieve lower fabrication costs and increase device density, device geometries may be scaled down. Due to the device scaling, a size of each photodetectors is decreased and the photodetectors are closer to one another (e.g., due to reducing a pitch of the pixel sensor). Electrical and optical isolation between adjacent photodetectors may be implemented to reduce blooming and increase quantum efficiency (QE) in the CIS. A deep trench isolation (DTI) structure is disposed in/on a back-side surface of the substrate. Generally, the DTI structure comprises an outer region that laterally wraps around an outer perimeter of the photodetectors and an inner region that is disposed between adjacent photodetectors. The DTI structure is configured to increase isolation between the photodetectors and adjacent pixel sensors, thereby increasing an overall performance of the CIS and facilitating scaling down of device features.

Challenges with the above CIS include cross-talk between adjacent photodetectors and/or pixel sensors and poor electrical isolation between adjacent pixel sensors. For example, the outer region and inner region of the DTI structure may have a same height that is generally smaller than a height of the substrate. This may reduce fabrication costs as the inner and outer regions may be formed concurrently, however, the smaller height of both the inner and outer regions of the DTI structure may reduce optical and electrical isolation of the CIS. For instance, by virtue of the smaller height of the outer region of the DTI structure, a portion of the substrate extends from a bottom surface of the outer region of the DTI structure to the front-side surface of the substrate. Incident light disposed at an angle relative to the back-side surface of the substrate may traverse this portion of the substrate to an adjacent pixel sensor, thereby increasing cross-talk between adjacent photodetectors and/or pixel sensors. Further, electrical isolation between pixel devices of the adjacent pixel sensors is decreased. In an effort to increase isolation, the height of both the outer region and the inner region of the DTI structure may be increased. However, this may result in an etch process, that is utilized to form an opening for the inner region of the DTI structure, damaging doped regions of the pixel sensors (e.g., may damage the floating diffusion node) and/or damaging the pixel devices. Further, increasing a height of the inner region of the DTI structure may reduce an area for doped regions of the pixel devices and/or the floating diffusion node, thereby decreasing an electrical performance of the CIS.

In some embodiments, the present application is directed towards a pixel sensor having an isolation structure that comprises an inner isolation structure and an outer isolation structure with different heights. For example, a pixel sensor may comprise a plurality of photodetectors disposed in a substrate and a plurality of pixel devices (e.g., transfer transistors) disposed along a front-side surface of the substrate. A floating diffusion node is disposed within the substrate at a center of the plurality of photodetectors. An interconnect structure is disposed on the front-side surface of the substrate and provides electrical coupling to the plurality of photodetectors and the plurality of pixel devices. An isolation structure is disposed in a back-side surface of the substrate and comprises an inner isolation structure and an outer isolation structure. The outer isolation structure laterally wraps around the plurality of photodetectors and the pixel devices, thereby demarcating an outer region of the pixel sensor. The inner isolation structure is grid shaped and disposed between adjacent photodetectors in the plurality of photodetectors. A first height of the outer isolation structure is greater than a second height of the inner isolation structure. This, in part, facilitates the outer isolation structure increasing optical and electrical isolation between the photodetectors and the pixel devices of the pixel sensor and other photodetectors and semiconductor devices disposed within/on the substrate. Further, the smaller second height of the inner isolation structure facilitates increasing optical and electrical isolation while mitigating damage to doped regions of the pixel sensor (e.g., the floating diffusion node) and/or the plurality of pixel devices. Thus, the inner isolation structure and the outer isolation structure having the different heights increases an overall performance of the pixel sensor.

FIG. 1 illustrates a cross-sectional view 100 of some embodiments of an image sensor comprising an isolation structure having an outer isolation structure and an inner isolation structure that have different heights.

The image sensor includes a plurality of photodetectors 122 disposed within a substrate 104 and an interconnect structure 102 disposed along a front-side surface 104$f$ of the substrate 104. In some embodiments, the substrate 104 comprises any semiconductor body (e.g., bulk silicon) and/or has a first doping type (e.g., p-type). The interconnect structure 102 comprises an interconnect dielectric structure 106, a plurality of conductive wires 108, and a plurality of conductive vias 110. A plurality of pixel devices 112 is disposed along the front-side surface 104$f$ of the substrate 104 and the pixel devices 112 are electrically coupled to one another and/or other semiconductor devices (not shown) by way of the plurality of conductive wires and vias 108, 110. The plurality of pixel devices 112 may comprise a gate electrode 116 and a gate dielectric layer 114 disposed between the gate electrode 116 and the front-side surface 104$f$ of the substrate 104.

A plurality of pixel sensors 103 is disposed across the substrate 104. The photodetectors 122 are disposed across the plurality of pixel sensors 103 and may each comprise a second doping type (e.g., n-type) opposite the first doping type (e.g., p-type). In various embodiments, the first doping type is p-type and the second doping type is n-type or vice versa. In various embodiments, a floating diffusion node 126 is disposed in the substrate 104 along the front-side surface 104$f$ and comprises the second doping type (e.g., n-type). The floating diffusion node 126 may be disposed at a center of a corresponding pixel sensor or at a center of a group of adjacent photodetectors (e.g., disposed at a center of a 2×2 array of photodetectors). The photodetectors 122 are configured to absorb incident light (e.g., photons) and generate respective electrical signals corresponding to the incident light. In such embodiments, the photodetectors 122 may generate electron-hole pairs from the incident light. In various embodiments, the pixel devices 112 may be configured to conduct readout of the generated electrical signals from the plurality of photodetectors 122. For example, the pixel devices 112 may comprise one or more transfer transistors configured to selectively form a conductive channel in the substrate 104 between the floating diffusion node 126 and adjacent photodetectors 122 to transfer accumulated charge (e.g., via absorbing incident radiation) in the photodetectors 122 to the floating diffusion node 126.

An isolation structure 130 comprises an outer isolation structure 132 and an inner isolation structure 134 that both extend into a back-side surface 104$b$ of the substrate 104. In some embodiments, the outer isolation structure 132 is referred to as a deep trench isolation structure and the inner isolation structure 134 is referred to as a deep trench grid structure. In various embodiments, a deep well region 128 is disposed on the back-side surface 104$b$ of the substrate 104 and comprises the second doping type (e.g., n-type) with a lower doping concentration than the photodetectors 122. In some embodiments, the deep well region 128 is configured to absorb incident light (e.g., photons) at a location above each photodetector 122 and generate electron-hole pairs from the incident light that may, for example, be transferred to a corresponding photodetector 122 thereby increasing a QE of each photodetector 122. By virtue of the outer isolation structure 132 laterally enclosing the photodetectors 122 and the inner isolation structure 134 being disposed between adjacent photodetectors 122, segments of the deep well region 128 over each photodetector 122 are isolated from one another, thereby further increasing optical and/or electrical isolation for each photodetector 122 (e.g., further decreasing cross-talk in the image sensor). In further embodiments, a doping concentration of the photodetectors 122 is within a range of about $10^{13}$ to $10^{14}$ atoms/cm$^3$, or another suitable value. In some embodiments, a doping concentration of the deep well region 128 is within a range of about $10^{12}$ to $10^{14}$ atoms/cm$^3$, or another suitable value.

Further, a shallow well region 124 is disposed along sidewalls of the outer isolation structure 132 and is configured to increase electrical isolation between adjacent photodetectors and between the plurality of pixel devices 112 disposed on the substrate 104. In various embodiments, the shallow well region 124 is ring-shaped when viewed from a top view and continuously wraps around the plurality of photodetectors 122 of a first pixel sensor 103a. The shallow well region 124 comprises the first doping type (e.g., p-type) and is adjacent to the plurality of photodetectors 122.

An upper dielectric layer 140 is disposed along the back-side surface 104b of the substrate 104. In various embodiments the upper dielectric layer 140 is configured as and/or referred to as a passivation layer. A conductive grid structure 142 overlies the upper dielectric layer 140 and a dielectric grid structure 144 overlies the conductive grid structure 142. The conductive grid structure 142 and the dielectric grid structure 144 comprise sidewalls that define a plurality of openings directly overlying a corresponding photodetector in the plurality of photodetectors 122. In various embodiments, the conductive grid structure 142 comprises one or more metal layers that is/are configured to reduce cross-talk between adjacent photodetectors in the plurality of photodetectors 122, thereby increasing optical isolation of the image sensor. In addition, the dielectric grid structure 144 is configured to direct light to the photodetectors 122 by total internal reflection such that cross-talk is further reduced and a quantum efficiency of the photodetectors 122 is increased. A plurality of light filters 146 is disposed in the plurality of openings defined by the sidewalls of the conductive grid structure 142 and the dielectric grid structure 144. The light filters 146 are configured to transmit specific wavelengths of incident light while blocking other wavelengths of incident light. Further, a plurality of micro-lenses 148 overlies the light filters 146 and is configured to focus the incident light towards the photodetectors 122.

The outer isolation structure 132 and the inner isolation structure 134 respectively comprise a trench fill layer 136 and a liner layer 138. In some embodiments, the liner layer 138 separates the trench fill layer 136 from the substrate 104. In further embodiments, the trench fill layer 136 comprises a first material and the liner layer 138 comprises a second material different from the first material. The first material may, for example, be or comprise an oxide, such as silicon dioxide, and the second material may, for example, be or comprise a high-k dielectric material. Further, an isolation etch stop layer 120 is disposed on a bottom surface of the outer isolation structure 132 and a contact etch stop layer (CESL) 118 is disposed on the front-side surface 104f of the substrate 104. In various embodiments, the isolation etch stop layer 120 directly contacts the bottom surface and opposing sidewalls of the outer isolation structure 132. The CESL 118 is disposed along the gate electrode 116 of each pixel device 112 and is disposed between the interconnect dielectric structure 106 and the front-side surface 104f of the substrate 104. In yet further embodiments, the isolation etch stop layer 120 continuously extends along an entire bottom surface of the outer isolation structure 132, where the isolation etch stop layer 120 has a similar layout and/or shape as the outer isolation structure 132 when viewed from above (i.e., the isolation etch stop layer 120 has a ring-shape).

The outer isolation structure 132 laterally encloses the plurality of photodetectors 122 of the first pixel sensor 103a and has a first height h1. In various embodiments, the outer isolation structure 132 demarcates an outer perimeter of the first pixel sensor 103a. The inner isolation structure 134 is disposed between adjacent photodetectors in the plurality of photodetectors 122 and has a second height h2. In various embodiments, the first height h1 is greater than the second height h2. By virtue of the first height h1 being greater than the second height h2, the outer isolation structure 132 increases optical and electrical isolation between the photodetectors 122 and pixel devices 112 of the first pixel sensor 103a and other photodetectors and/or pixel devices disposed within/on the substrate 104. Further, the smaller second height h2 of the inner isolation structure 134 promotes isolation between the photodetectors 122 of the first pixel sensor 103a while mitigating damage to doped regions of the first pixel sensor 103a (e.g., the floating diffusion node 126) and/or the plurality of pixel devices 112. Accordingly, the image sensor comprising the inner isolation structure 134 and the outer isolation structure 132 with different heights increases optical and electrical isolation of the image sensor while mitigating damage to doped regions and/or structures of the image sensor during fabrication, thereby increasing an overall performance of the image sensor.

In some embodiments, the isolation structure 130 may be referred to as a deep trench isolation (DTI) structure or a back-side DTI Structure. In various embodiments, the outer isolation structure 132 may be referred to as a full-depth DTI structure and the inner isolation structure 134 may be referred to as a partial-depth DTI structure. In yet further embodiments, the outer isolation structure 132 surrounds the photodetectors 122 of the first pixel sensor 103a and the inner isolation structure 134 separates the photodetectors 122 from one another, where a depth of the inner isolation structure 134 is smaller than a depth of the outer isolation structure 132.

Figure 2A:
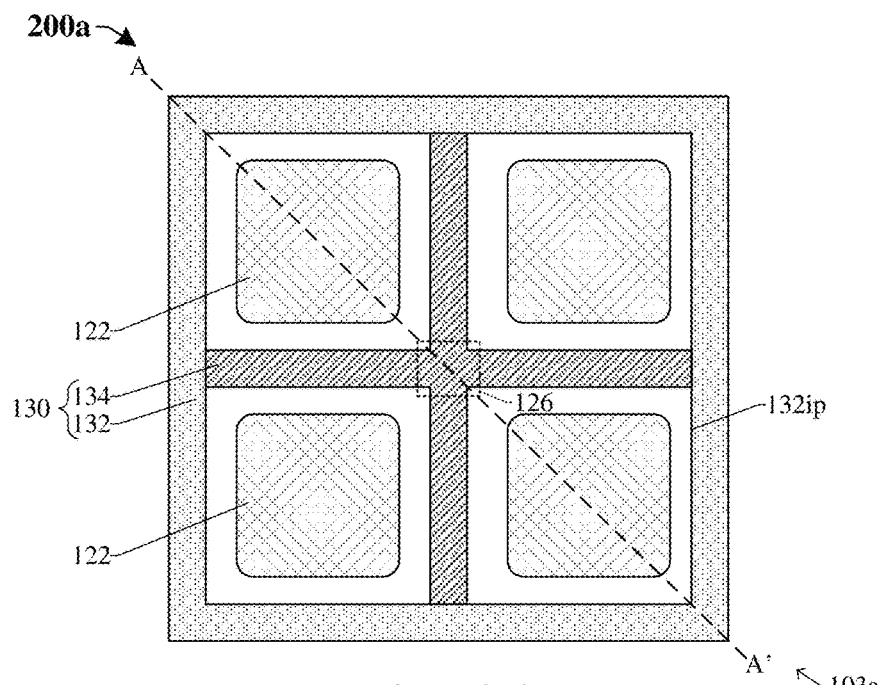
FIGS. 2A-2E illustrate various top views of some embodiments of the image sensor of FIG. 1 taken along the line A-A'.

FIG. 2A illustrates a top view 200a of some embodiments of the image sensor of FIG. 1 taken along the line A-A' of FIG. 1. For ease of illustration, the outer isolation structure 132 and the inner isolation structure 134 have different fill patterns in FIG. 2A, however, it will be appreciated that, in some embodiments, the outer isolation structure 132 and the inner isolation structure 134 comprise same material(s) and/or layer(s) as illustrated and/or described in FIGS. 1 and 2B.

In various embodiments, the first pixel sensor 103a is configured as a 2×2 photodetector pixel sensor. In some embodiments, the outer isolation structure 132 continuously laterally encloses the inner isolation structure 134 such that the inner isolation structure 134 is spaced within an inner perimeter 132ip of the outer isolation structure 132. In various embodiments, the outer isolation structure 132 has a first shape (e.g., a ring-shape) when viewed from above and the inner isolation structure 134 has a second shape (e.g., a cross-shape) when viewed from above that is different from the first shape. The inner isolation structure 134 has a grid structure and continuously extends between adjacent photodetectors in the plurality of photodetectors 122 of the first pixel sensor 103a. The outer isolation structure 132 continuously wraps around the plurality of photodetectors 122 of the first pixel sensor 103a and demarcates a device region of the first pixel sensor 103a. In further embodiments, a center region of the inner isolation structure 134 directly overlies the floating diffusion node 126.

In various embodiments, by virtue of the outer isolation structure 132 having the relatively large first height (h1 of FIG. 1) and laterally enclosing the first pixel sensor 103a, electrical and optical isolation between devices (e.g., the photodetectors 122 and/or pixel devices (112 of FIG. 1)) of the first pixel sensor 103a and other devices (not shown) disposed within/on the substrate 104 is increased. Further, in some embodiments, by virtue of the inner isolation structure 134 having the relatively small second height (e.g., h2 of FIG. 1 being less than the first height h1 of FIG. 1) and having the grid structure, electrical and optical isolation between the photodetectors 122 of the first pixel sensor 103a is increased while mitigating damage to doped regions of the first pixel sensor 103a during fabrication of the isolation structure 130. Accordingly, the different layouts and heights of the outer isolation structure 132 and the inner isolation structure 134 increase an overall performance of the image sensor.

Figure 2B:
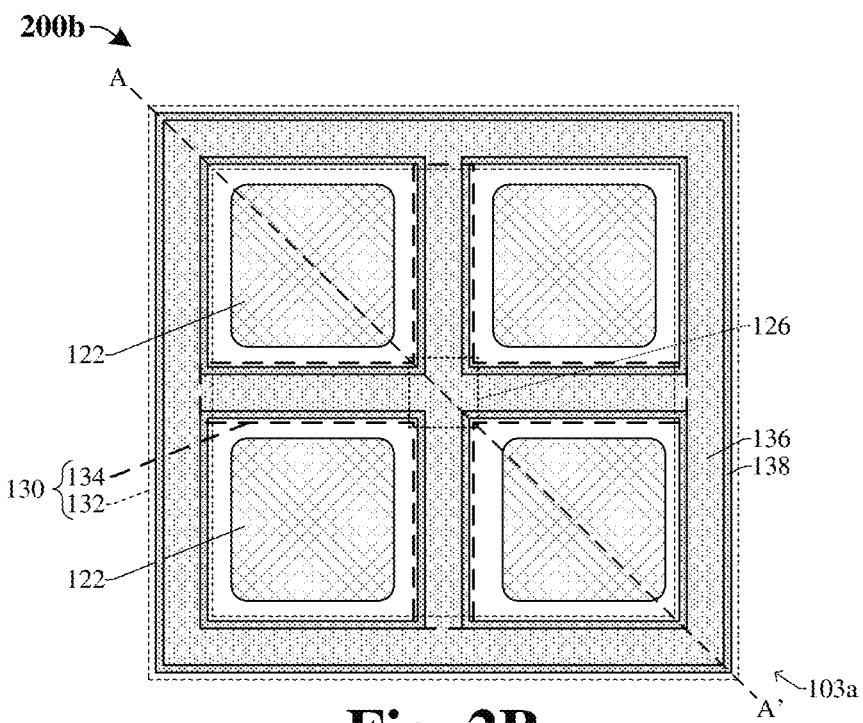

FIG. 2B illustrates a top view 200b of some alternative embodiments of the top view 200a of FIG. 2A, in which the outer isolation structure 132 and the inner isolation structure 134 respectively comprise the trench fill layer 136 and the liner layer 138. In various embodiments, the trench fill layer 136 and the liner layer 138 of the outer isolation structure 132 have a ring-shape when viewed from above and have the first height (h1 of FIG. 1). Further, in some embodiments, the trench fill layer 136 and the liner layer 138 of the inner isolation structure 134 have a cross-shape when viewed from above and have the second height (h2 of FIG. 1).

Figure 2C:
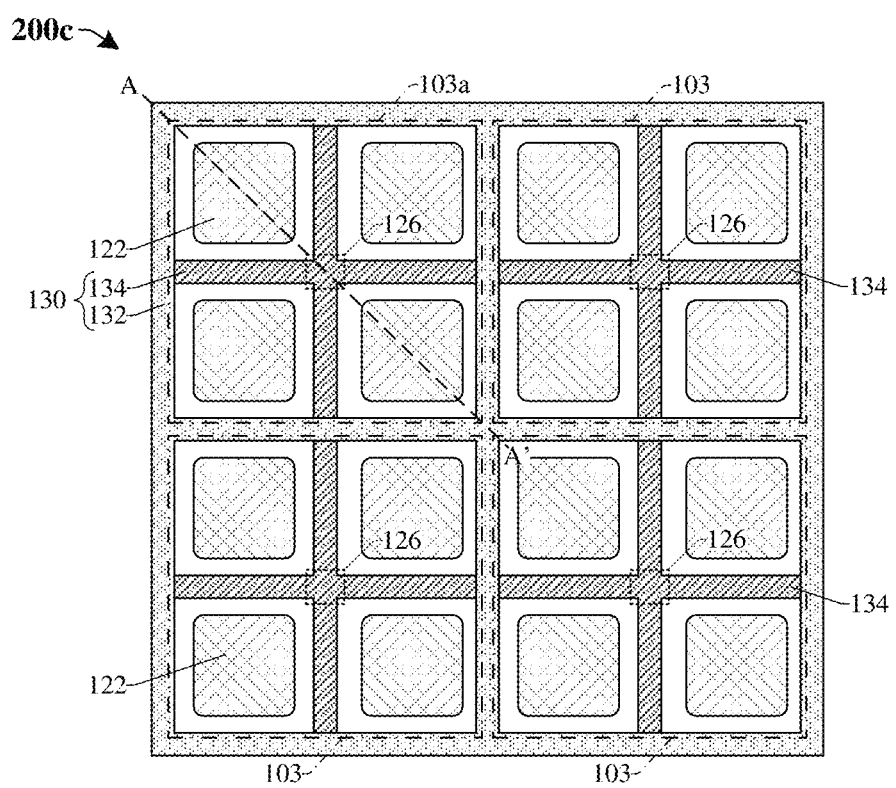

FIG. 2C illustrates a top view 200c of some alternative embodiments of the top view 200a of FIG. 2A, in which the plurality of pixel sensors 103 are disposed in an array and are each configured as a 2×2 photodetector pixel sensor as illustrated and/or described in FIG. 2A.

Figure 2D:
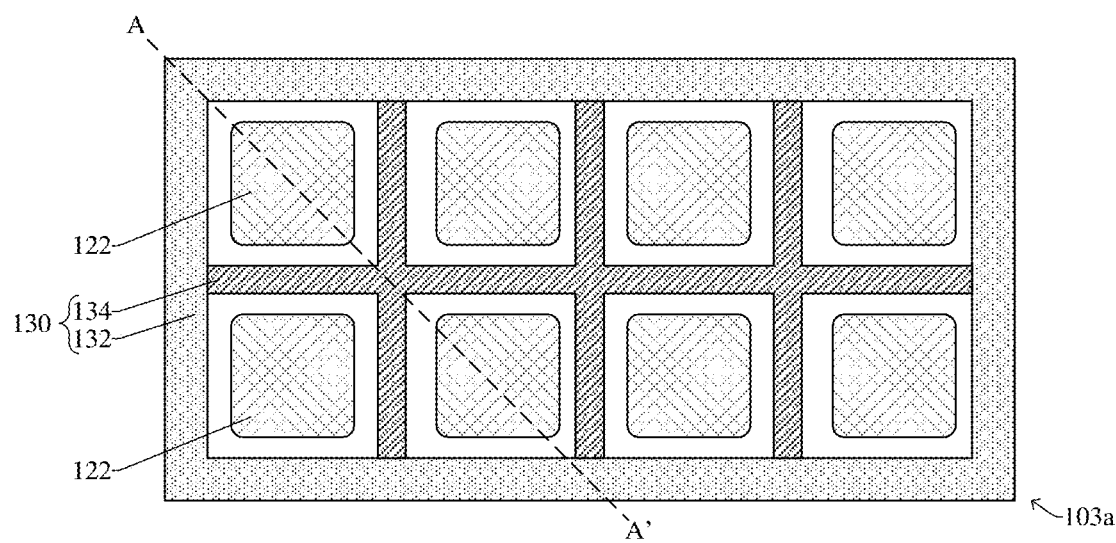

FIG. 2D illustrates a top view 200d of some alternative embodiments of the top view 200a of FIG. 2A, in which the first pixel sensor 103a is configured as a 2×4 photodetector pixel sensor. For ease of illustration, the outer isolation structure 132 and the inner isolation structure 134 have different fill patterns in FIG. 2D, however, it will be appreciated that, in some embodiments, the outer isolation structure 132 and the inner isolation structure 134 comprise same material(s) and/or layer(s) as illustrated and/or described in FIGS. 1 and 2B.

Figure 2E:
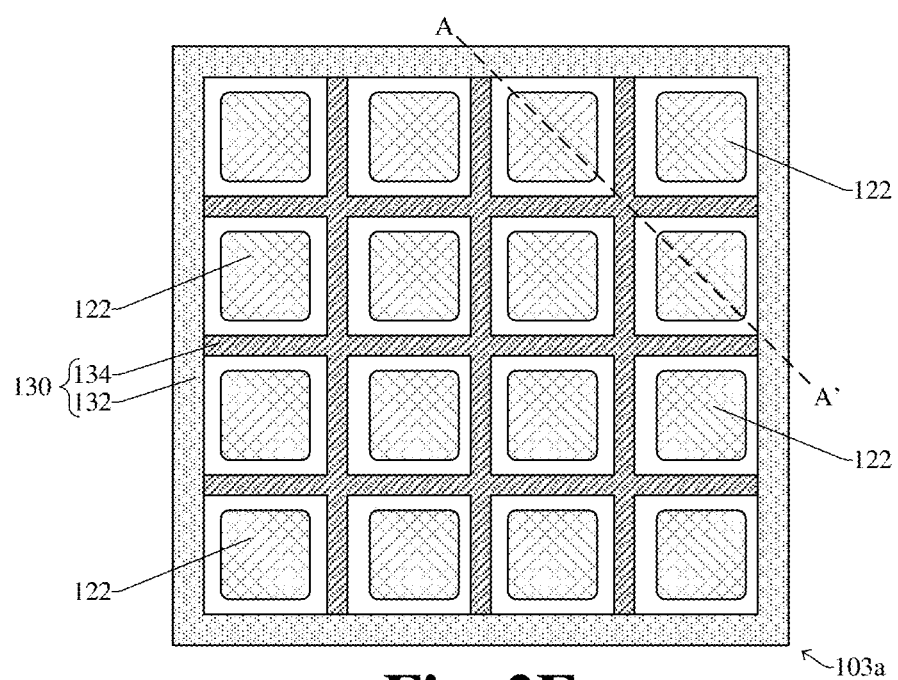

FIG. 2E illustrates a top view 200e of some alternative embodiments of the top view 200a of FIG. 2A, in which the first pixel sensor 103a is configured as a 4×4 photodetector pixel sensor. For ease of illustration, the outer isolation structure 132 and the inner isolation structure 134 have different fill patterns in FIG. 2E, however, it will be appreciated that, in some embodiments, the outer isolation structure 132 and the inner isolation structure 134 comprise same material(s) and/or layer(s) as illustrated and/or described in FIGS. 1 and 2B.

Figure 3A:
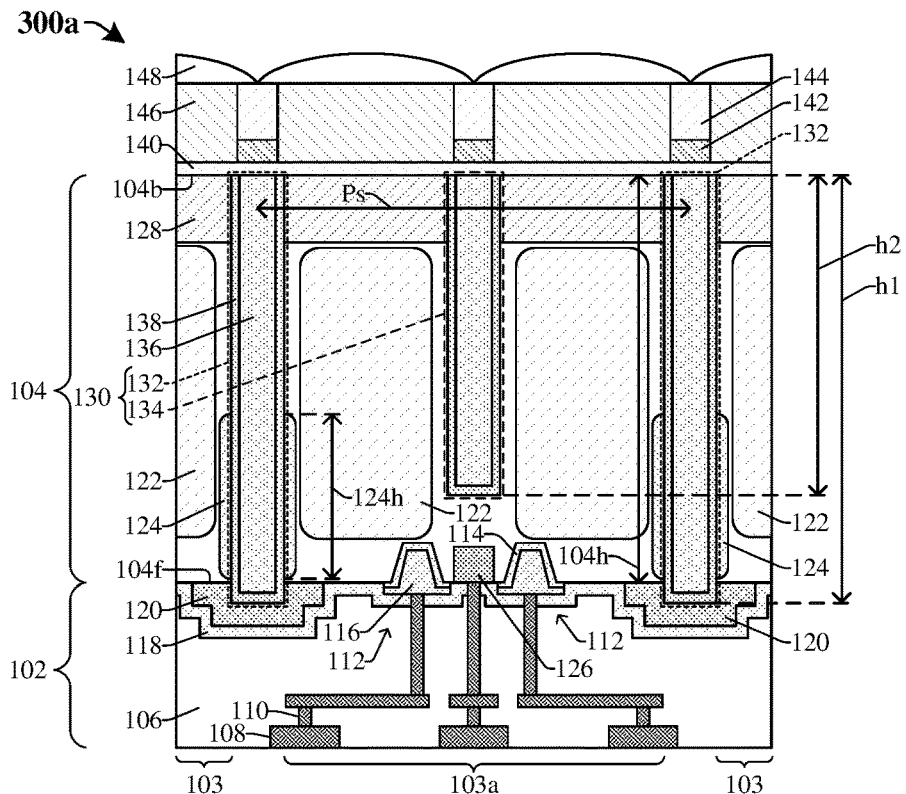
FIG. 3A illustrates a cross-sectional view of some other embodiments of the image sensor of FIG. 1.

FIG. 3A illustrates a cross-sectional view 300a of some embodiments of an image sensor comprising an isolation structure having an outer isolation structure and an inner isolation structure that have different heights.

The isolation structure 130 extends into a back-side surface 104b of the substrate 104 and comprises the outer isolation structure 132 and the inner isolation structure 134. The outer isolation structure 132 laterally encloses the photodetectors 122 of the first pixel sensor 103a and demarcates an outer perimeter of the first pixel sensor 103a. The substrate 104 may, for example, be or comprise monocrystalline silicon, epitaxial silicon, germanium, silicon-germanium, a III-V material (e.g., gallium nitride, gallium arsenide, etc.), a silicon-on-insulator (SOI) substrate, another semiconductor material, or the like. In some embodiments, the substrate 104 has a first doping type (e.g., p-type). The interconnect structure 102 is disposed on the front-side surface 104f of the substrate 104 and comprises an interconnect dielectric structure 106, a plurality of conductive wires 108, and a plurality of conductive vias 110. The interconnect dielectric structure 106 may comprise one or more dielectric layers that may each, for example, be or comprise silicon dioxide, a low-k dielectric material, an extreme low-k dielectric material, or any combination of the foregoing. As used herein, a low-k dielectric material is a dielectric material with a dielectric constant less than 3.9. The conductive wires and vias 108, 110 may, for example, each be or comprise aluminum, copper, ruthenium, tungsten, another conductive material, or any combination of the foregoing.

A plurality of pixel devices 112 are disposed within/on the front-side surface 104f. In some embodiments, the pixel devices 112 are configured as vertical transfer transistors and respectively comprise a gate electrode 116 that extends into the front-side surface 104f and a gate dielectric layer 114 that is disposed between the gate electrode 116 and the substrate 104. The gate electrode 116 may, for example, be or comprise polysilicon a metal material such as aluminum, titanium, tantalum, tungsten, another metal material, or any combination of the foregoing. The gate dielectric layer 114 may, for example, be or comprise silicon dioxide, a high-k dielectric material such as tantalum oxide, hafnium oxide, aluminum oxide, another dielectric material, or the like. As used herein, a high-k dielectric material is a dielectric material with a dielectric constant greater than 3.9.

An isolation etch stop layer 120 is disposed on a bottom surface of the outer isolation structure 132. A contact etch stop layer (CESL) 118 is disposed between the front-side surface 104f of the substrate and the interconnect dielectric structure 106. The isolation etch stop layer 120 may, for example, be or comprise silicon nitride, silicon carbide, silicon oxynitride, silicon oxycarbide, or the like. Further, the CESL 118 may, for example, be or comprise silicon carbide, silicon oxycarbide, or the like. In various embodiments, the isolation etch stop layer 120 comprises a first dielectric material (e.g., silicon nitride) and the CESL 118 comprises a second dielectric material (e.g., silicon carbide) different from the first dielectric material. In various embodiments, the isolation etch stop layer 120 is U-shaped and directly contacts opposing sidewalls of the outer isolation structure 132 and cups the bottom surface of the outer isolation structure 132. In yet further embodiments, a thickness of the isolation etch stop layer 120 is greater than a thickness of the CESL 118.

The photodetectors 122 are disposed in the substrate 104 and comprise a second doping type (e.g., n-type) opposite the first doping type. A floating diffusion node 126 is disposed along the front-side surface 104f of the substrate 104 between adjacent pixel devices 112 and directly underlies a segment of the inner isolation structure 134. In some embodiments, a doping concentration of the floating diffusion node 126 is greater than the doping concentration of the photodetectors 122. A shallow well region 124 is disposed in the substrate 104 along sidewalls of the outer isolation structure 132. The shallow well region 124 comprises the first doping type (e.g., p-type). A deep well region 128 is disposed on the back-side surface 104b of the substrate 104 and is disposed along opposing sidewalls of the inner isolation structure 134 and opposing sidewalls of the outer isolation structure 132. In various embodiments, the deep well region 128 a same doping type as the plurality of photodetectors 122 (i.e., comprises the second doping type (e.g., n-type)), thereby increasing a QE of each photodetector 122.

The outer isolation structure 132 and the inner isolation structure 134 respectively comprise a trench fill layer 136 and a liner layer 138. The trench fill layer 136 may, for example, be or comprise an oxide, such as silicon dioxide, another dielectric material, or the like. Further, the liner layer 138 may, for example, be or comprise a high-k dielectric material, hafnium oxide, titanium oxide, aluminum oxide, zirconium oxide, another suitable dielectric material, or the like. A pitch Ps of the first pixel sensor 103a is defined between a center of segments of the outer isolation structure 132. In some embodiments, the pitch Ps is within a range of about 0.2 micrometers (um) to about 2 um, within a range of about 0.2 um to 1 um, within a range of about 1 um to about 2 um, or another suitable value. In various embodiments, a height 104h of the substrate 104 is within a range of about 2 um to about 6 um, within a range of about 2 um to 4 um, within a range of about 4 um to 6 um, or some other suitable value. In some embodiments, a height 124h of the shallow well region 124 is within a range of about 2 um to about 2.5 um, or some other suitable value. In yet further embodiments, a width of the shallow well region 124 along sidewalls of the outer isolation structure 132 is within a range of about 0.5 um to about 1.5 um, or some other suitable value.

In various embodiments, a first height h1 of the outer isolation structure 132 is within a range of about 3 um to about 6.5 um, within a range of about 3 um to about 5 um, within a range of about 3 um to about 6 um, within a range of about 4.5 um to about 6.5 um, or some other suitable value. In yet further embodiments, a second height h2 of the inner isolation structure 134 is within a range of about 1.5 um to about 5 um, within a range of about 1.5 um to about 3 um, within a range of about 3 um to about 5 um, or some other suitable values. In some embodiments, the first height h1 is greater than or equal to the height 104h of the substrate 104 and is greater than the second height h2, thereby facilitating the outer isolation structure 132 increasing optical and electrical isolation of the image sensor. In further embodiments, the second height h2 is less than the height 104h of the substrate 104, thereby facilitating the inner isolation structure 134 increasing optical and electrical isolation of the image sensor while mitigating damage to doped regions (e.g., the floating diffusion node 126) and/or the pixel devices 112 of the image sensor. In yet further embodiments, the first height h1 is greater than the pitch Ps and/or the second height h2 is greater than the pitch Ps.

In various embodiments, by virtue of the first height h1 being greater than the second height h2, the outer isolation structure 132 may increase optical and electrical isolation between the photodetectors 122 and pixel devices 112 of the first pixel sensor 103a and other devices/structures (e.g., other photodetectors and/or other pixel devices of adjacent pixel sensors 103) disposed within/on the substrate 104. In addition, the smaller second height h2 of the inner isolation structure 134 promotes electrical and optical isolation between adjacent photodetectors 122 and/or pixel devices 112 while mitigating damage to doped regions of the first pixel sensor 103a and/or the plurality of pixel devices 112. For example, during fabrication of the first pixel sensor 103a an etch process is performed (e.g., the etch process forms an opening for the inner isolation structure 134 and/or defines the second height h2 of the inner isolation structure 134) into the back-side surface 104b of the substrate 104. In various embodiments, the etch process is performed at a suitable power and duration such that the second height h2 is relatively small (e.g., less than the first height h1 and/or less than the height 104h of the substrate 104) and such that the etch process does not over etch deeply into the floating diffusion node 126 and/or the pixel devices 112. This, in part, facilitates increasing optical and electrical isolation in the image sensor while mitigating damage to structures and/or devices of the image sensor. Accordingly, an overall performance of the image sensor is increased.

In some embodiments, by virtue of the first height h1 being relatively large (e.g., equal to or greater than about 3 um), the outer isolation structure 132 is sufficiently deep to mitigate cross-talk between adjacent pixel sensors 103 and increase electrical isolation between adjacent pixel sensors 103. In further embodiments, by virtue of the first height h1 being less than about 6.5 um, the outer isolation structure 132 increases optical and electrical isolation of the image sensor while mitigating damage to the interconnect structure 102 and/or the pixel devices 112 during fabrication of the image sensor. In various embodiments, by virtue of the second height h2 being greater than about 1.5 um, the inner isolation structure 134 is sufficiently deep to mitigate cross-talk between adjacent photodetectors 122 in the first pixel sensor 103a and increase electrical isolation between the pixel devices 112. In further embodiments, by virtue of the second height being relatively small (e.g., equal to or less than about 5 um), optical and electrical isolation of the image sensor is increased while mitigating damage to doped regions of the first pixel sensor 103a and/or the plurality of pixel devices 112 during fabrication of the image sensor.

Figure 3B:
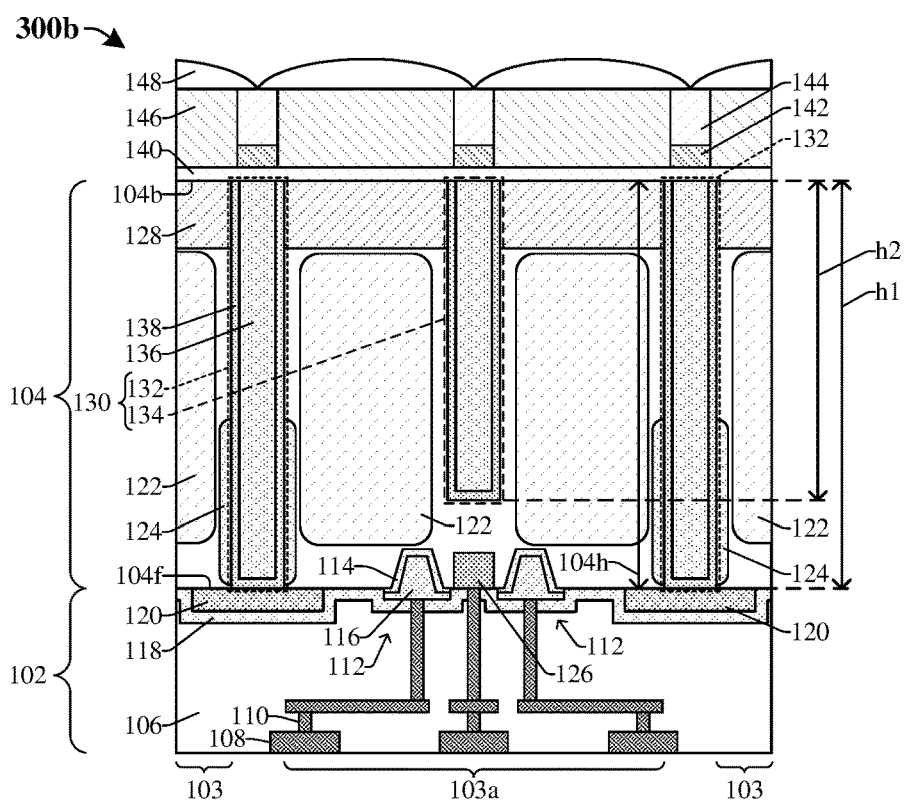
FIG. 3B illustrates a cross-sectional view of some other embodiments of the image sensor of FIG. 1, where a bottom surface of the outer isolation structure is aligned with a front-side surface of a substrate.

FIG. 3B illustrates a cross-sectional view 300b of some alternative embodiments of the image sensor of FIG. 3A, in which a bottom surface of the outer isolation structure 132 is aligned with the front-side surface 104f of the substrate 104. In various embodiments, the first height h1 of the outer isolation structure 132 is equal to the height 104h of the substrate 104. In some embodiments, the isolation etch stop layer 120 has a single planar top surface that is in direct contact with the front-side surface 104f of the substrate and the bottom surface of the outer isolation structure 132.

Figure 3C:
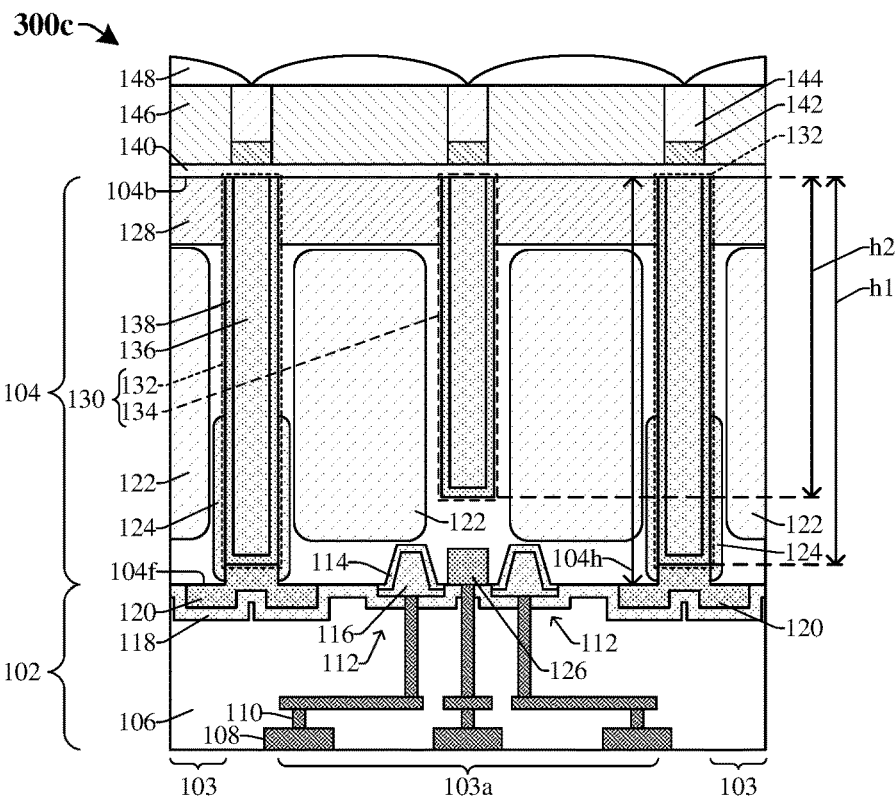
FIG. 3C illustrates a cross-sectional view of some other embodiments of the image sensor of FIG. 1, where a bottom surface of the outer isolation structure is vertically above a front-side surface of a substrate.

FIG. 3C illustrates a cross-sectional view 300c of some alternative embodiments of the image sensor of FIG. 3A, in which a bottom surface of the outer isolation structure 132 is vertically above the front-side surface 104f of the substrate 104. In some embodiments, the isolation etch stop layer 120 comprises a protrusion that extends into the front-side surface 104f, where the isolation etch stop layer 120 continuously vertically extends from the bottom surface of the outer isolation structure 132 to below the front-side surface 104f of the substrate 104. In various embodiments, the first height h1 of the outer isolation structure 132 is less than the height 104h of the substrate 104.

Figure 3D:
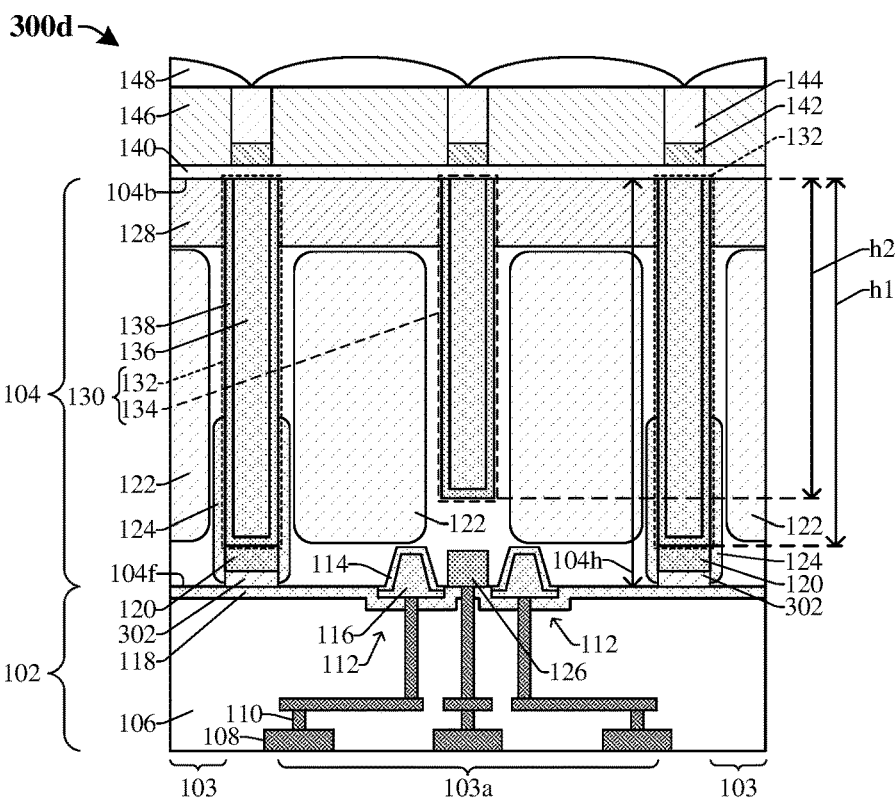
FIG. 3D illustrates a cross-sectional view of some other embodiments of the image sensor of FIG. 1, where a bottom surface of the outer isolation structure is vertically above a front-side surface of a substrate.

FIG. 3D illustrates a cross-sectional view 300d of some alternative embodiments of the image sensor of FIG. 3A, in which a bottom surface of the outer isolation structure 132 is vertically above the front-side surface 104f of the substrate 104. In various embodiments, the isolation etch stop layer 120 is disposed within the substrate 104 and directly contacts the bottom surface of the outer isolation structure 132. Further, an isolation dielectric layer 302 is disposed between the isolation etch stop layer 120 and the CESL 118. In various embodiments, the isolation dielectric layer 302 comprises a dielectric material (e.g., an oxide such as silicon dioxide) different from that of the isolation etch stop layer 120. In some embodiments, the isolation dielectric layer 302 comprises an oxide such as silicon dioxide, and the isolation etch stop layer 120 comprises silicon nitride, silicon carbide, silicon oxynitride, another dielectric material, or the like. In yet further embodiments, a thickness of the isolation etch stop layer 120 is greater than a thickness of the isolation dielectric layer 302. In yet further embodiments, the isolation etch stop layer 120 and the isolation dielectric layer 302 have a same layout and/or shape as the outer isolation structure 132 when viewed from above. For example, each the isolation etch stop layer 120, the isolation dielectric layer 302, and/or the outer isolation structure 132 respectively have a ring-shape when viewed from above. In yet further embodiments, a bottom surface of the isolation dielectric layer 302 is vertically aligned with the front-side surface 104f of the substrate 104.

Figure 3E:
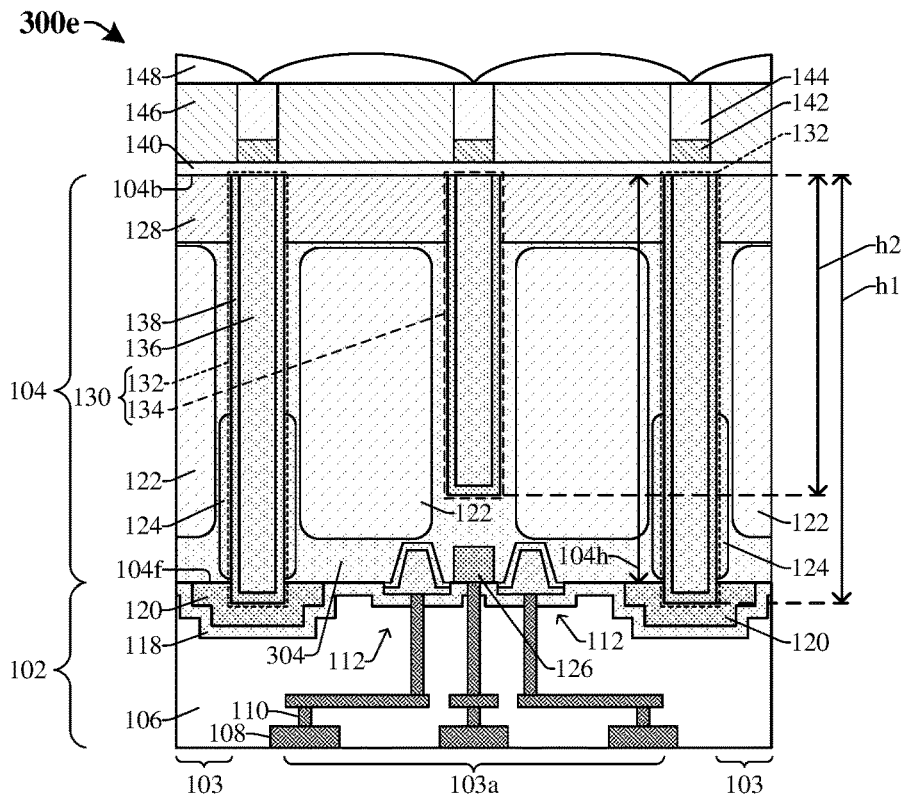
FIG. 3E illustrates a cross-sectional view of some other embodiments of the image sensor of FIG. 1, where a well region is disposed along sidewalls of the outer and inner isolation structures.

FIG. 3E illustrates a cross-sectional view 300e of some alternative embodiments of the image sensor of FIG. 3A, in which the substrate 104 further comprises a well region 304 having the first doping type (e.g., p-type). In some embodiments, the well region 304 encloses each photodetector 122, surrounds the floating diffusion node 126, and extends along sidewalls of the isolation structure 130. In various embodiments, a doping concentration of the well region 304 is within a range of about $10^{12}$ to $10^{14}$ atoms/cm$^3$, or another suitable value.

Figure 3F:
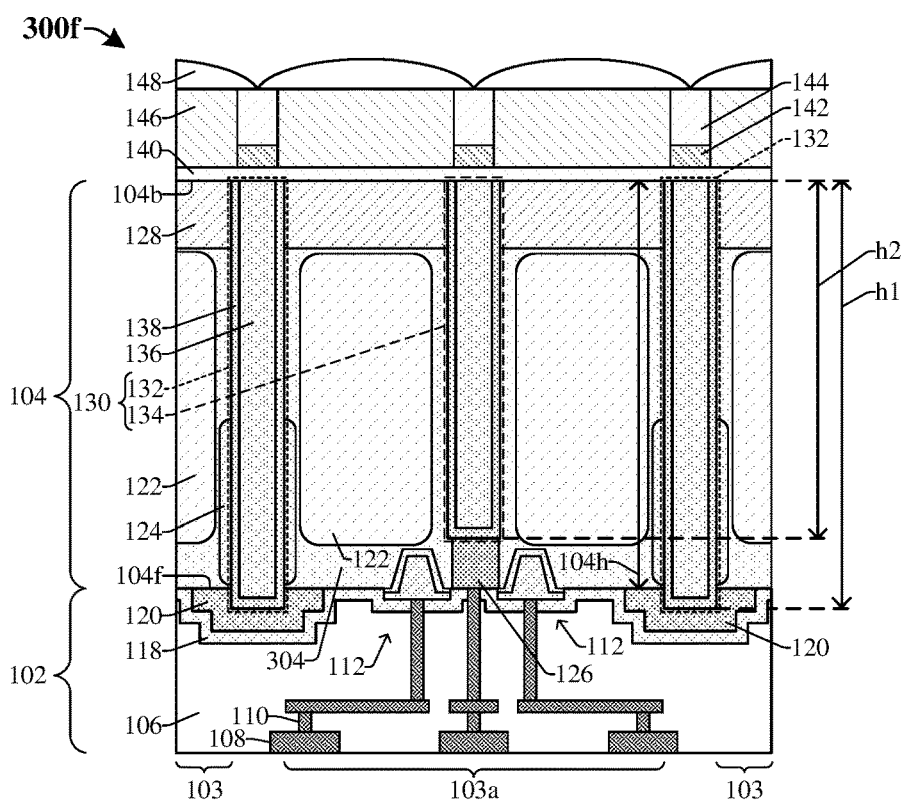
FIG. 3F illustrates a cross-sectional view of some other embodiments of the image sensor of FIG. 1, where the inner isolation structure contacts a floating diffusion node.

FIG. 3F illustrates a cross-sectional view 300f of some alternative embodiments of the image sensor of FIG. 3A, in which the inner isolation structure 134 contacts the floating diffusion node 126.

Figure 3G:
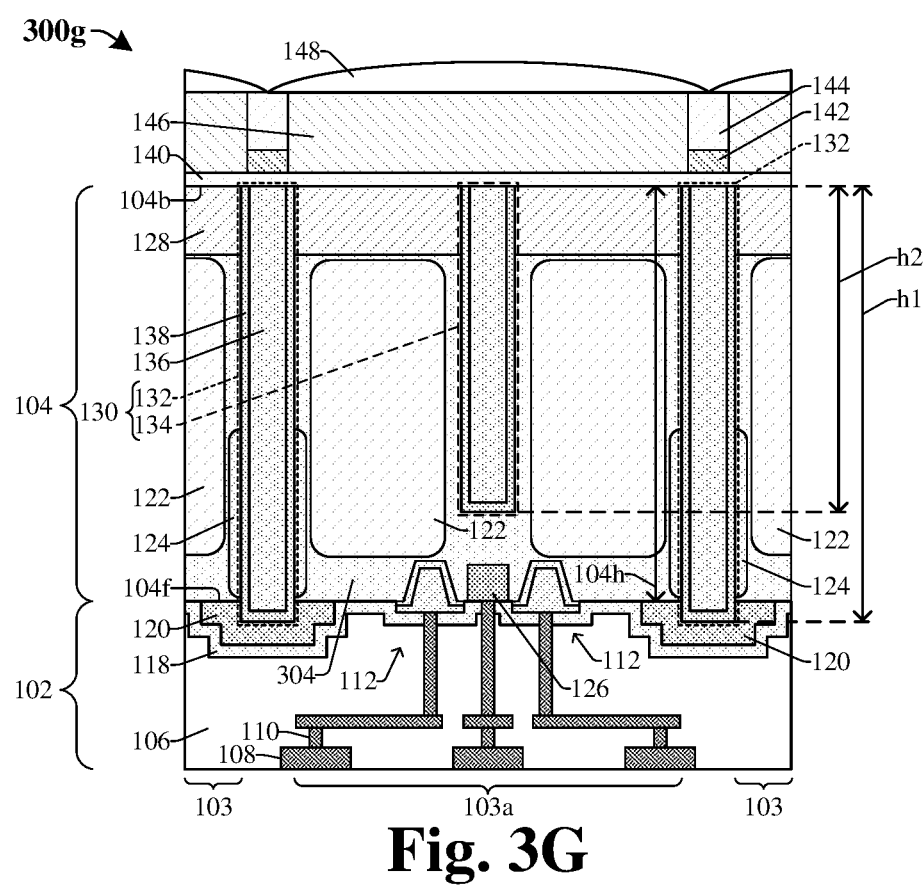
FIG. 3G illustrates a cross-sectional view of some other embodiments of the image sensor of FIG. 1, where a single light filter overlies the inner isolation structure and a single micro-lens overlies the inner isolation structure.

FIG. 3G illustrates a cross-sectional view 300g of some alternative embodiments of the image sensor of FIG. 3A, in which a single light filter 146 overlies the photodetectors 122 of the first pixel sensor 103a and a single micro-lens 148 overlies the photodetectors 122 of the first pixel sensor 103a.

While the well region 304 of FIG. 3E is illustrated using embodiments of the isolation structure 130 in FIG. 3A, it is to be understood that the well region 304 may be used with embodiments of the isolation structure 130 in any one of FIGS. 1 and 3B-3D. As such, the well region 304 may be directly under the deep well region 128 in any one of FIGS. 1 and 3B-3D. While the single light filter 146 and single micro-lens 148 of FIG. 3G is illustrated using embodiments of the isolation structure 130 in FIG. 3A, the single light filter 146 and single micro-lens 148 may be used with embodiments of the isolation structure 130 in any one of FIGS. 1 and 3B-3F. As such, the single light filter 146 and single micro-lens 148 of FIG. 3G may be directly over the inner isolation structure 134 in any one of FIGS. 1 and 3B-3F.

Figure 4:
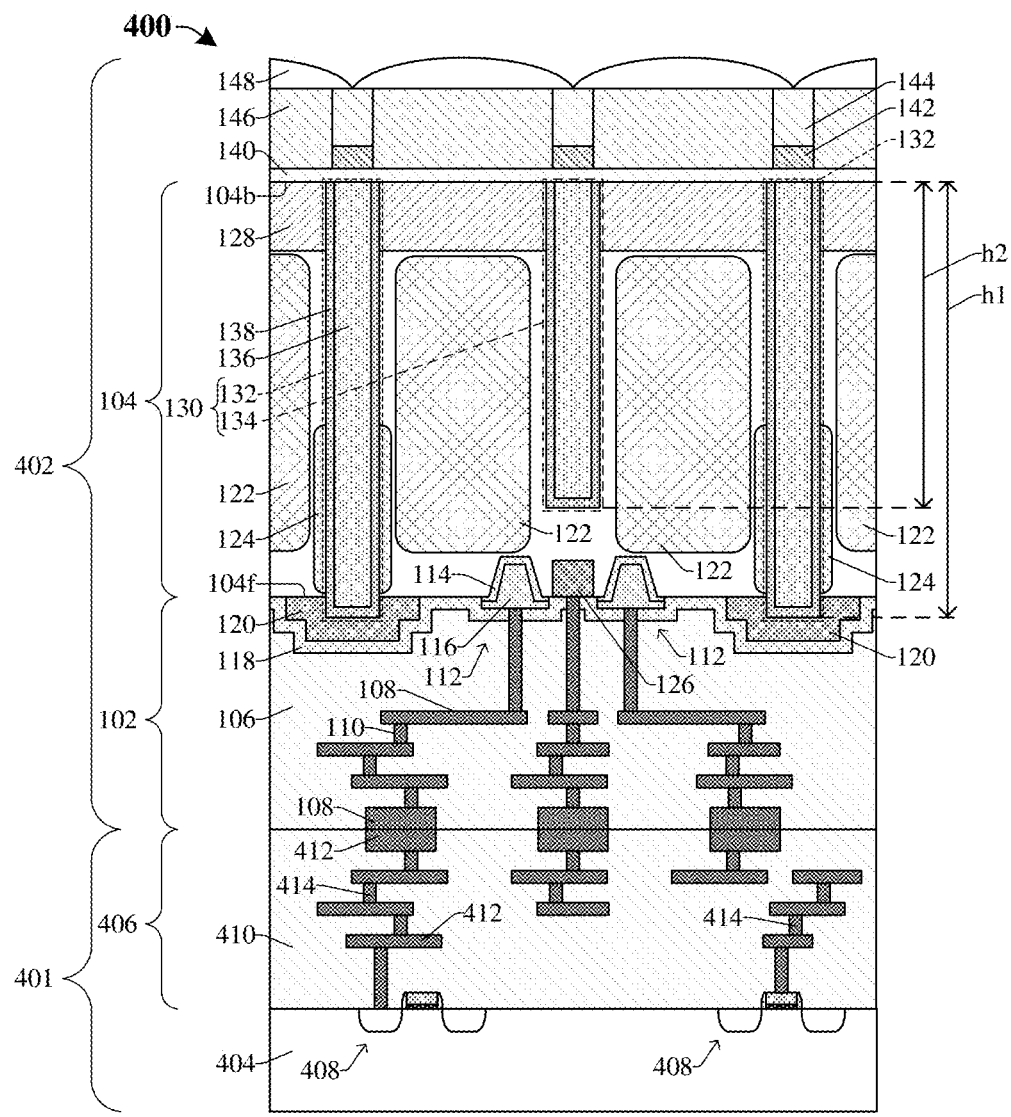
FIG. 4 illustrates a cross-sectional view of some embodiments of an integrated chip comprising an image sensor structure overlying a lower semiconductor structure.

FIG. 4 illustrates a cross-sectional view 400 of some embodiments of an integrated chip comprising an image sensor structure 402 overlying a lower semiconductor structure 401. In various embodiments, the image sensor structure 402 may be configured as the image sensor of any one of FIGS. 1 and 3A-3G.

In various embodiments, the lower semiconductor structure 401 comprises a lower interconnect structure 406 overlying a lower substrate 404. The lower substrate 404 may, for example, be or comprise monocrystalline silicon, epitaxial silicon, germanium, silicon-germanium, a III-V material (e.g., gallium nitride, gallium arsenide, etc.), a silicon-on-insulator (SOI) substrate, another semiconductor material, or the like. Further, a plurality of semiconductor devices 408 is disposed within and/or on the lower substrate 404. In some embodiments, the plurality of semiconductor devices 408 comprise transistor(s), capacitor(s), some other suitable semiconductor device, or any combination of the foregoing. For example, the semiconductor devices 408 may be configured as and/or comprise transistors that are facilitate readout of the electrical signals generated by the photodetectors 122. In yet further embodiments, the lower semiconductor structure 401 may be configured as an application-specific integrated circuit (ASIC) or the like. Further, the semiconductor devices 408 may, for example, be configured as logic devices.

In further embodiments, the lower interconnect structure 406 comprises a lower dielectric structure 410, a plurality of lower conductive vias 414, and a plurality of lower conductive wires 412. The lower conductive wires and vias 412, 414 are disposed within the lower dielectric structure 410 and are configured to couple the semiconductor devices 408 to the pixel devices 112 by way of the interconnect structure 102. In yet further embodiments, the interconnect structure 102 and the lower interconnect structure 406 meet at a bond interface and are electrically coupled to one another.

FIGS. 5-18 illustrate cross-sectional views 500-1800 of some embodiments of a method for forming an image sensor comprising an isolation structure having an outer isolation structure and an inner isolation structure that have different heights. Although the cross-sectional views 500-1800 shown in FIGS. 5-18 are described with reference to the method, it will be appreciated that the structures shown in FIGS. 5-18 are not limited to the method but rather may stand alone separate of the method. Furthermore, although FIGS. 5-18 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 5:
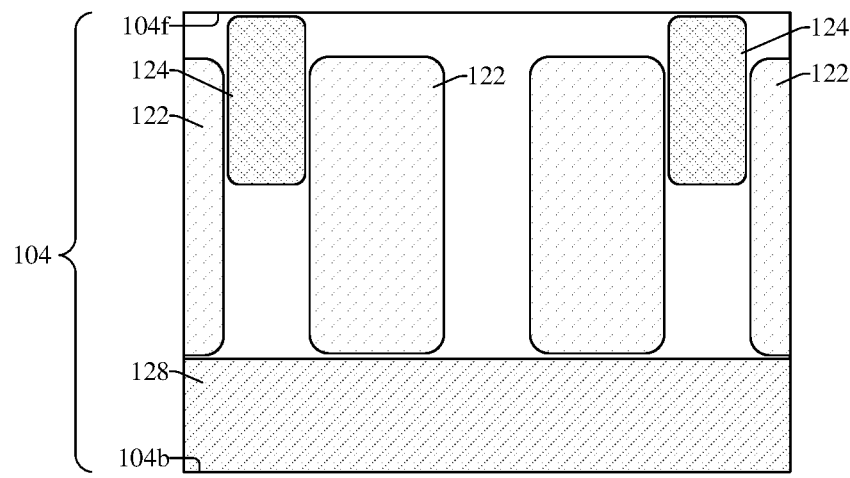
FIGS. 5-18 illustrate cross-sectional views of some embodiments of a method for forming an image sensor comprising an isolation structure having an outer isolation structure and an inner isolation structure that have different heights.

As shown in cross-sectional view 500 of FIG. 5, one or more ion implantation processes is/are performed to form a deep well region 128, a shallow well region 124, and a plurality of photodetectors 122 in a substrate 104. In some embodiments, the substrate 104 may, for example, be or comprise a bulk silicon substrate, monocrystalline silicon, epitaxial silicon, silicon germanium (SiGe), or another suitable semiconductor material and/or comprises a first doping type (e.g., p-type). The substrate 104 comprises a front-side surface 104f that is opposite a back-side surface 104b. Further, the substrate 104 has a first doping type (e.g., p-type). In various embodiments, an ion implantation process comprises: selectively forming a masking layer (not shown) over the front-side surface 104f of the substrate 104; performing a selective ion implantation process according to the masking layer, thereby implanting one or more dopants within the substrate 104; and performing a removal process to remove the masking layer (not shown). In some embodiments, a first ion implantation process may be performed to form the plurality of photodetectors 122 such that the photodetectors 122 comprise a second doping type (e.g., n-type) opposite the first doping type; a second ion implantation process may be performed to form the shallow well region 124 such that the shallow well region 124 comprises the first doping type; and a third ion implantation process may be performed to from the deep well region 128 such that the deep well region 128 comprises the second doping type (e.g., n-type). In various embodiments, the photodetectors 122 have a higher doping concentration than the deep well region 128. In further embodiments, the one or more ion implantation processes is/are performed to further form a well region (304 of FIG. 3E) within the substrate 104 between the front-side surface 104f and the deep well region

128. In yet further embodiments, the third ion implantation process may be performed without forming a masking layer over the substrate 104.

Figure 6:
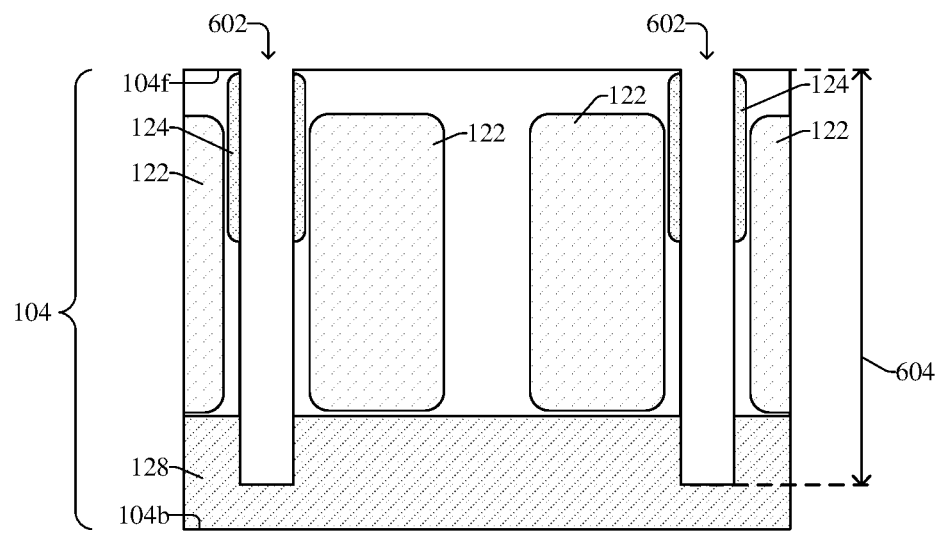

As illustrated in cross-sectional view 600 of FIG. 6, a patterning process is performed on the front-side surface 104f of the substrate 104 to form an outer isolation opening 602 extending into the front-side surface 104f. In some embodiments, the patterning process includes: forming a masking layer (not shown) over the front-side surface 104f of the substrate 104; etching (e.g., by a dry etch process and/or a wet etch process) the substrate 104 according to the masking layer; and removing the masking layer. In various embodiments, the outer isolation opening 602 has a height 604 that is less than a height of the substrate 104. In yet further embodiments, the outer isolation opening 602 is formed such that the outer isolation opening 602 is ring-shaped when viewed from above and continuously laterally wraps around the plurality of photodetectors 122.

Figure 7:
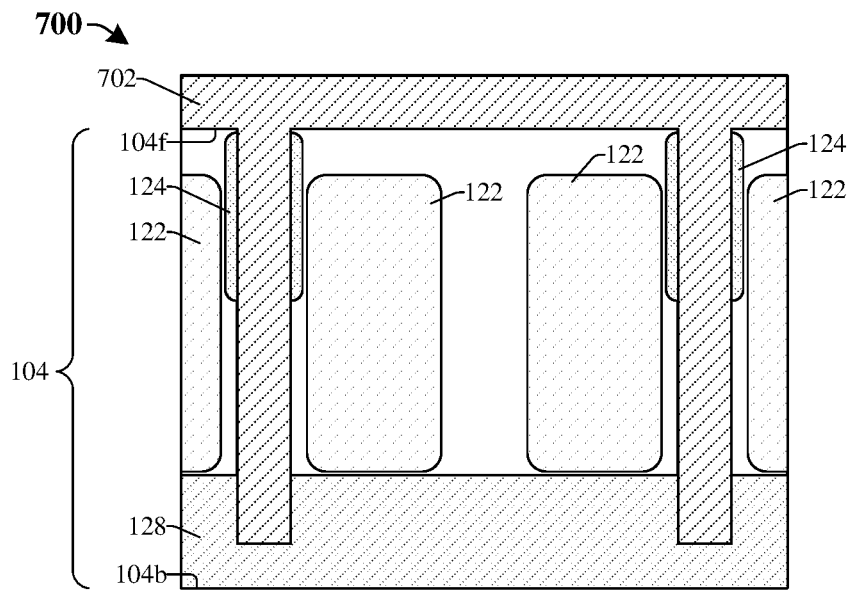

As illustrated in cross-sectional view 700 of FIG. 7, a dielectric layer 702 is deposited over the front-side surface 104f of the substrate 104 and fills the outer isolation opening (602 of FIG. 6). In some embodiments, the dielectric layer 702 comprises an oxide (e.g., silicon dioxide), some other dielectric material, or the like. Further, the dielectric layer 702 may, for example, be deposited by a physical vapor deposition (PVD) process, a chemical vapor deposition (CVD) process, an atomic layer deposition (ALD) process, another suitable growth or deposition process, or any combination of the foregoing.

Figure 8A:
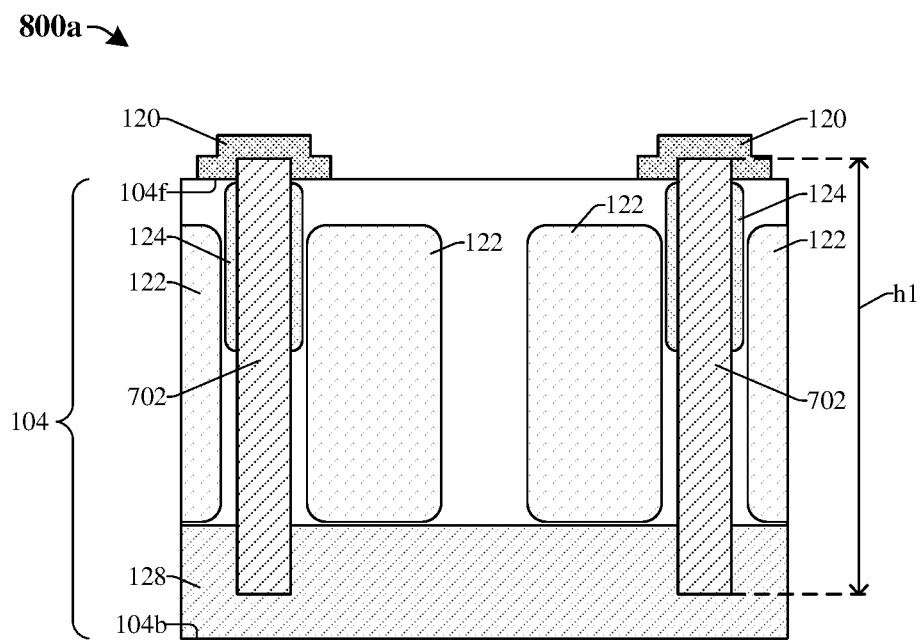

As illustrated in cross-sectional view 800a of FIG. 8A, a removal process is performed on the dielectric layer 702 and an isolation etch stop layer 120 is formed on the dielectric layer 702 and the front-side surface 104f of the substrate 104. In some embodiments, the removal process includes performing a patterning process (e.g., comprising a dry etch process and/or a wet etch process), a planarization process (e.g., a chemical mechanical planarization (CMP) process), some other suitable removal process, or any combination of the foregoing. After the removal process, the dielectric layer 702 has a first height h1 that is, for example, within a range of about 3 um to 6.5 um, within a range of about 3 um to about 5 um, within a range of about 4.5 um to about 6.5 um, or some other suitable value. In further embodiments, a process for forming the isolation etch stop layer 120 comprises: depositing (e.g., by CVD, PVD, ALD, etc.) the isolation etch stop layer 120 on the dielectric layer 702, and performing a patterning process on the isolation etch stop layer 120. In some embodiments, the isolation etch stop layer 120 has a ring-shape when viewed from above.

Figure 8B:
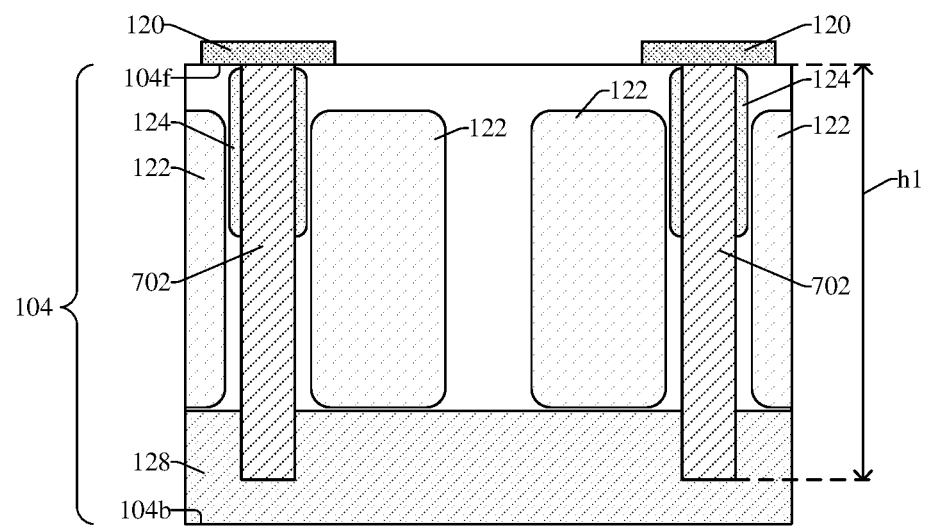

The cross-sectional view 800b of FIG. 8B illustrates an alternative embodiment of the cross-sectional view 800a of FIG. 8A, in which the removal process is performed such that a top surface of the dielectric layer 702 is aligned with the front-side surface 104f of the substrate 104. In such embodiments, the removal process includes performing a planarization process (e.g., a CMP process) into the dielectric layer 702 until the front-side surface 104f of the substrate 104 is reached. Further, the isolation etch stop layer 120 is formed such that the isolation etch stop layer 120 comprises a single planar bottom surface that directly contacts the top surface of the dielectric layer 702 and the front-side surface 104f of the substrate 104.

Figure 8C:
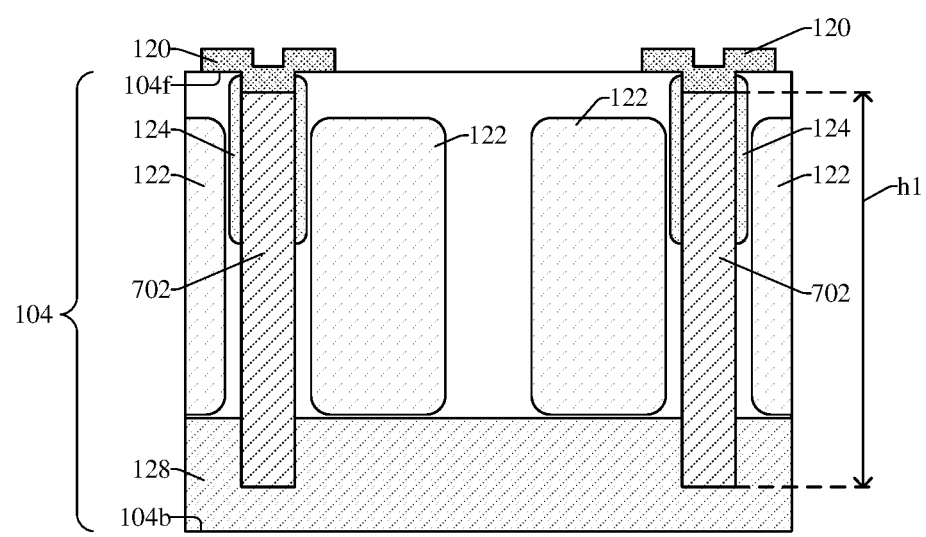

The cross-sectional view 800c of FIG. 8C illustrates an alternative embodiment of the cross-sectional view 800a of FIG. 8A, in which the removal process is performed such that a top surface of the dielectric layer 702 is disposed below the front-side surface 104f of the substrate 104. In such embodiments, the removal process includes performing a planarization process and/or a patterning process into the dielectric layer 702 such that the dielectric layer 702 is recessed below the front-side surface 104f of the substrate 104. In yet further embodiments, the removal process includes performing an etch back process on the dielectric layer 702. Further, the isolation etch stop layer 120 is formed such that the isolation etch stop layer 120 comprises a protrusion extending into the front-side surface 104f of the substrate 104.

Figure 8D:
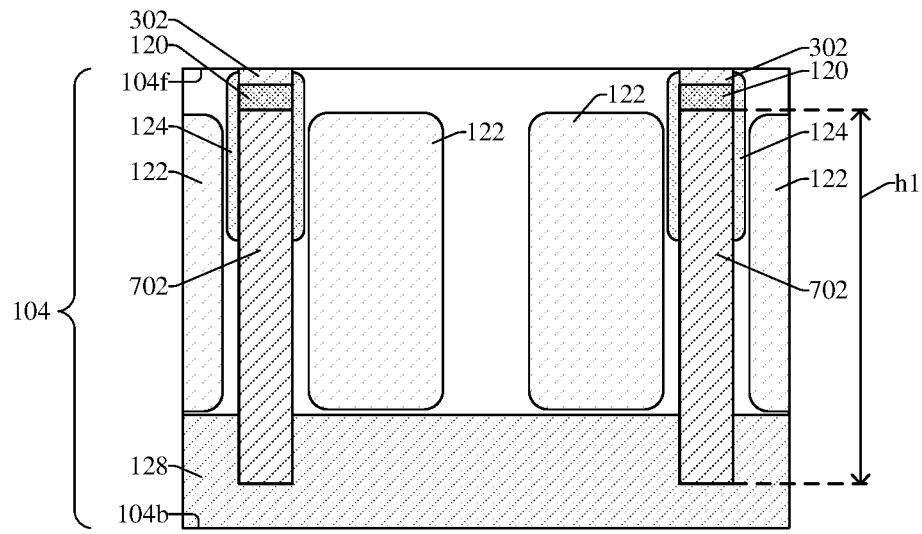

The cross-sectional view 800d of FIG. 8D illustrates an alternative embodiment of the cross-sectional view 800a of FIG. 8A, in which the removal process is performed such that a top surface of the dielectric layer 702 is disposed below the front-side surface 104f of the substrate 104 and an isolation dielectric layer 302 is formed on the isolation etch stop layer 120. In such embodiments, the removal process includes performing a planarization process and/or a patterning process into the dielectric layer 702 such that the dielectric layer 702 is recessed below the front-side surface 104f of the substrate 104. In yet further embodiments, the removal process includes performing an etch back process on the dielectric layer 702. Further, the isolation etch stop layer 120 is formed such that a top surface of the isolation etch stop layer 120 is disposed below the front-side surface 104f of the substrate 104. Further, the isolation dielectric layer 302 may be formed over the isolation etch stop layer 120 by a CVD process, a PVD process, an ALD process, or the like. In yet further embodiments, a planarization process (e.g., a CMP process) may be performed into the isolation dielectric layer 302 such that a top surface of the isolation dielectric layer 302 is co-planar with the front-side surface 104f of the substrate 104.

Figure 9:
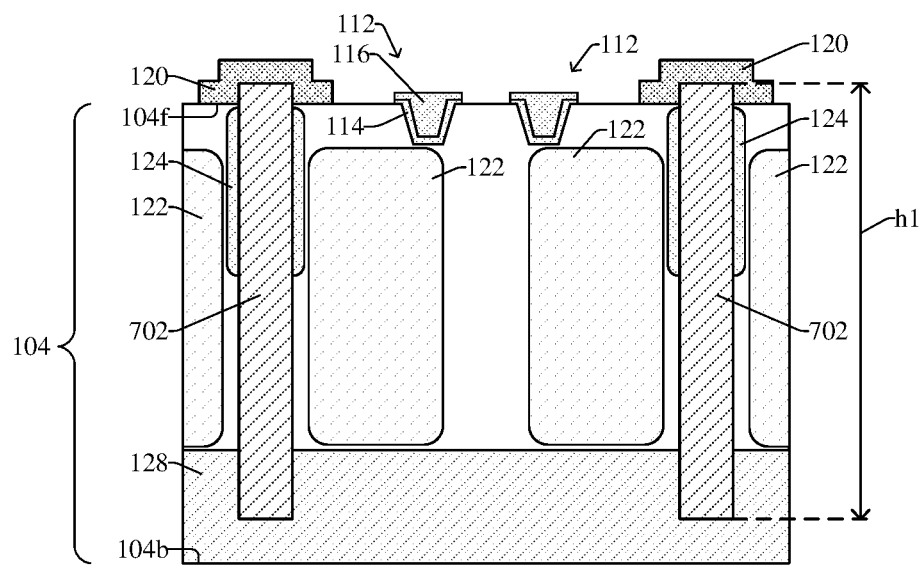

As illustrated in cross-sectional view 900 of FIG. 9, a plurality of pixel devices 112 are formed on the front-side surface 104f of the substrate 104. In some embodiments, each of the pixel devices 112 comprise a gate electrode 116 and a gate dielectric layer 114 disposed between the gate electrode 116 and the substrate 104. In various embodiments, a process for forming the pixel devices 112 comprises: patterning the substrate 104 to define trenches extending into the front-side surface 104f of the substrate 104; depositing (e.g., by CVD, PVD, ALD, etc.) a gate dielectric material over the substrate 104 and lining the trenches; depositing (e.g., by CVD, PVD, ALD, electroplating, electroless plating, etc.) a gate electrode material over the gate dielectric material; and pattering the gate electrode material and the gate dielectric material. In yet further embodiments, the plurality of pixel devices 112 may be formed by one or more deposition process(es), one or more patterning process(es), one or more planarization process(es), one or more ion implantation process(es), and/or some other suitable process(es).

Figure 10:
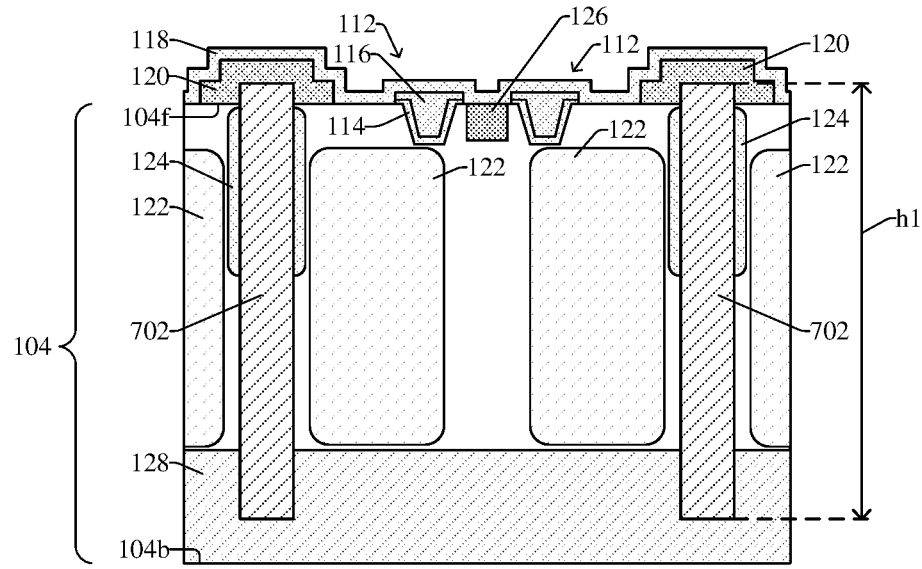

As illustrated in cross-sectional view 1000 of FIG. 10, a contact etch stop layer (CESL) 118 is formed over the front-side surface 104f of the substrate 104. In various embodiments, the CESL 118 is formed by a CVD process, an ALD process, a PVD process, some other suitable growth or deposition process, or the like.

Figure 11:
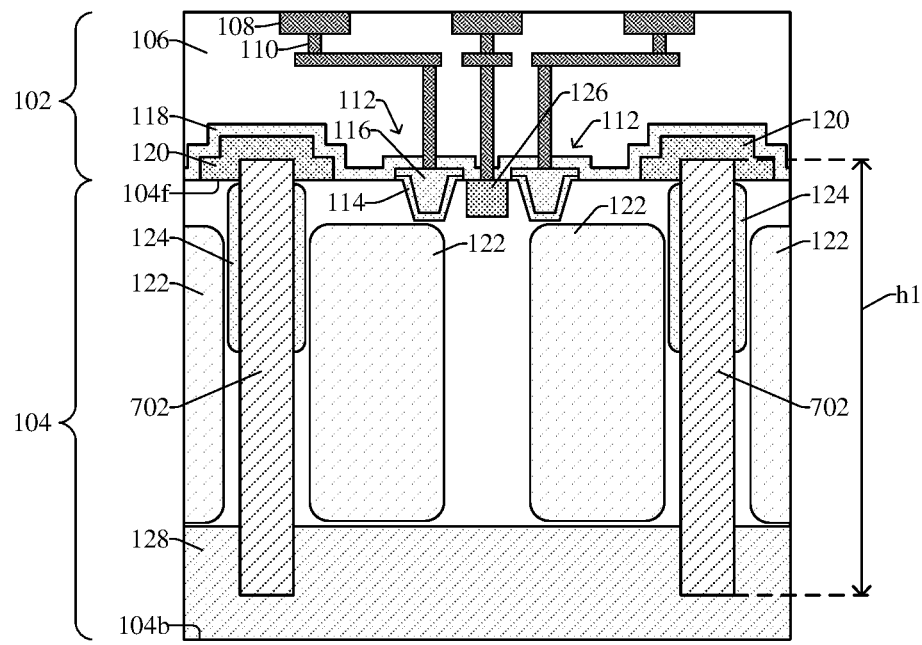

As illustrated in cross-sectional view 1100 of FIG. 11, an interconnect structure 102 is formed along the front-side surface 104f of the substrate 104. The interconnect structure 102 comprises an interconnect dielectric structure 106, a plurality of conductive wires 108, and a plurality of conductive vias 110. In various embodiments, the interconnect dielectric structure 106 may be formed by one or more deposition process(es) such as a physical vapor deposition (PVD) process, a chemical vapor deposition (CVD) process, an atomic layer deposition (ALD) process, another suitable growth or deposition process, or any combination of the foregoing. In further embodiments, the plurality of conductive wires 108 and/or the plurality of conductive vias 110 may be formed by one or more deposition process(es), one or more patterning process(es), one or more planarization process(es), one or more ion implantation process(es), or some other suitable process(es).

Figure 12:
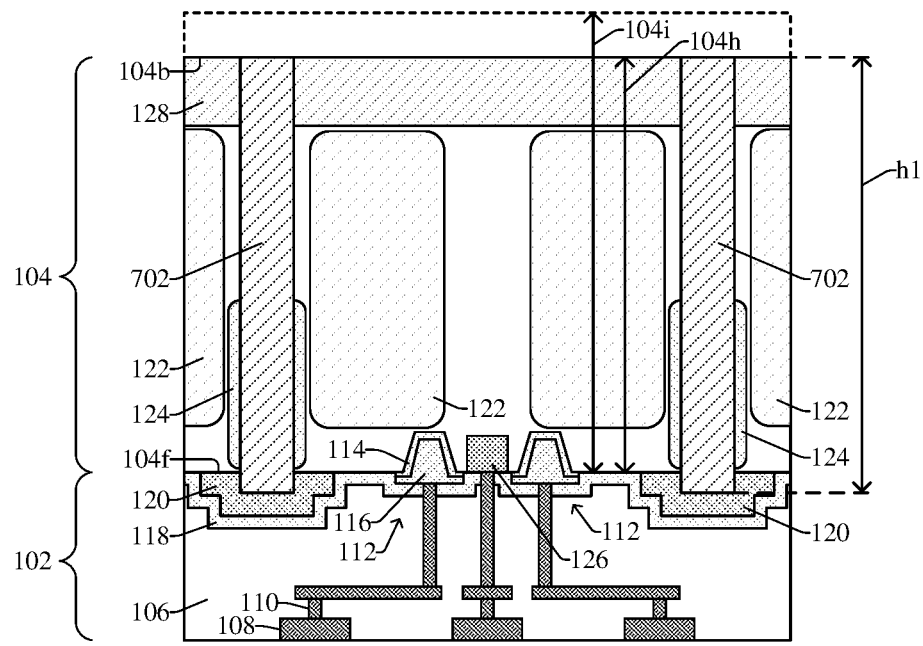

As illustrated in cross-sectional view 1200 of FIG. 12, the structure of FIG. 11 is rotated and a thinning process is performed on the substrate 104. In various embodiments, the thinning process reduces a height of the substrate 104 from an initial substrate height 104i to a height 104h. In some embodiments, the height 104h of the substrate 104 is within a range of about 2 um to about 6 um, within a range of about 2 um to 4 um, within a range of about 4 um to 6 um, or some other suitable value. In further embodiments, the thinning process includes performing a CMP process, a mechanical grinding process, another suitable thinning process, or any combination of the foregoing. In various embodiments, the thinning process removes at least a portion of the deep well region 128 and/or is completed until a top surface of the dielectric layer 702 is reached.

Figure 13:
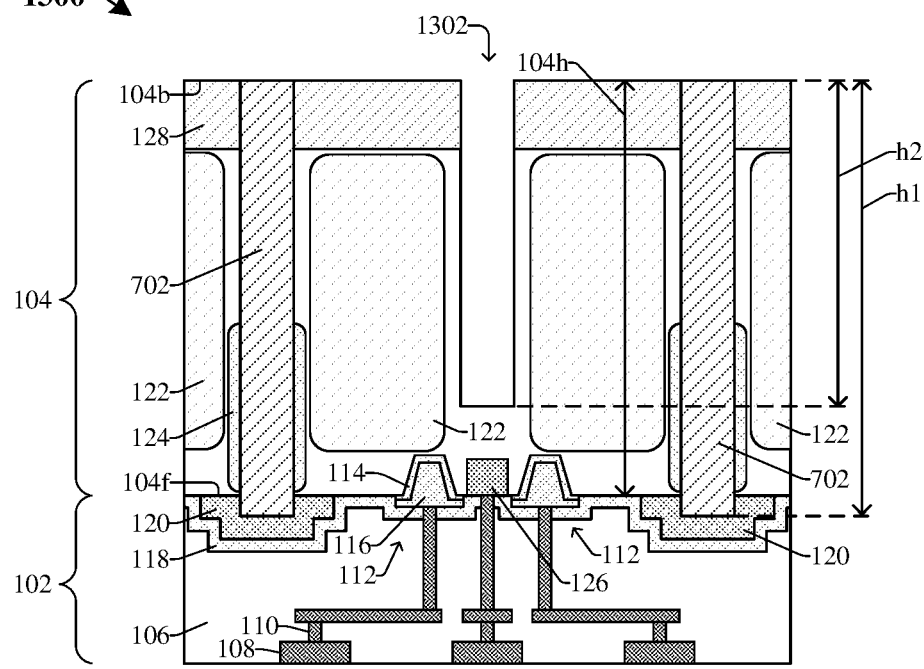

As illustrated in cross-sectional view 1300 of FIG. 13, a patterning process is performed on the back-side surface 104b of the substrate 104 to form an inner isolation opening 1302 extending into the back-side surface 104b. In some embodiments, the patterning process includes: forming a masking layer (not shown) over the back-side surface 104b of the substrate 104; etching (e.g., by a dry etch process and/or a wet etch process) the substrate 104 according to the masking layer; and removing the masking layer. In various embodiments, the inner isolation opening 1302 has a second height h2 that is less than the first height h1. In some embodiments, the second height h2 of the inner isolation opening 1302 is within a range of about 1.5 um to about 6 um, within a range of about 1.5 um to about 5.5 um, or some other suitable values. In yet further embodiments, the inner isolation opening 1302 is formed such that the inner isolation opening 1302 is cross-shaped when viewed from above and spaced between adjacent photodetectors in the plurality of photodetectors 122. In various embodiments, the inner isolation opening 1302 is at least partially defined by sidewalls of the dielectric layer 702 (not shown).

Figure 14:
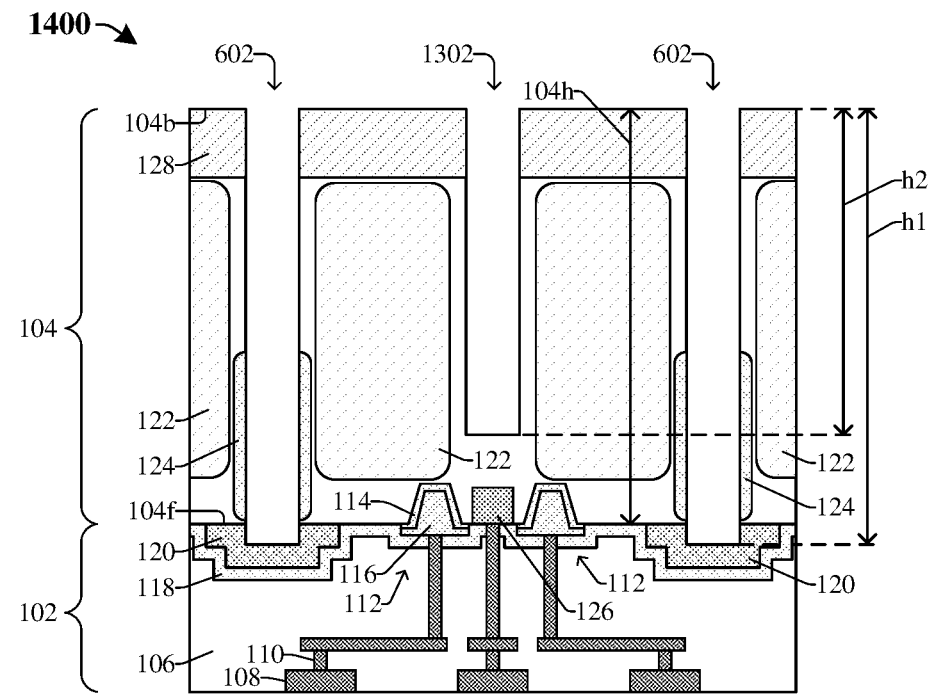

As illustrated in cross-sectional view 1400 of FIG. 14, a removal process is performed to remove the dielectric layer (702 of FIG. 13) from the outer isolation opening 602. In various embodiments, the removal process includes performing a dry etch, a wet etch, or some other suitable process. Further, the removal process is performed such that the outer isolation opening 602 is in fluid connection with the inner isolation opening 1302. In yet further embodiments, the removal process stops on the isolation etch stop layer 120, where the isolation etch stop layer 120 is configured to prevent over-etching into the CESL 118 and/or the interconnect structure 102. Further, the isolation etch stop layer 120 facilitates the outer isolation opening 602 maintaining the first height h1.

Figure 15:
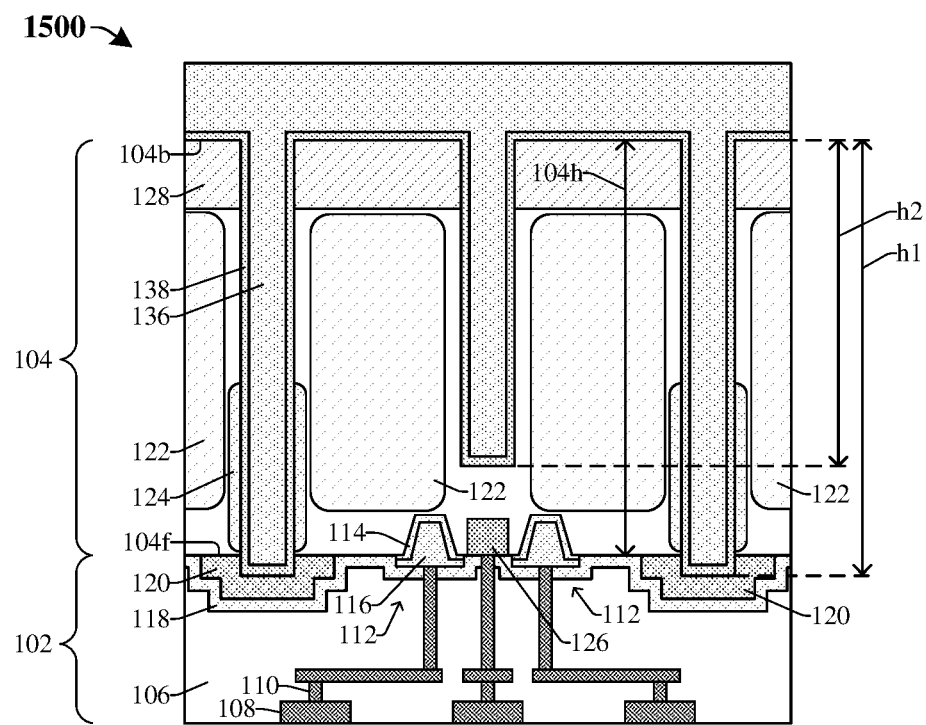

As illustrated in cross-sectional view 1500 of FIG. 15, a liner layer 138 is deposited over the substrate 104 lining the outer isolation opening 602 and the inner isolation opening 1302, and a trench fill layer 136 is deposited over the liner layer 138. In some embodiments, the liner layer 138 and trench fill layer 136 are respectively deposited by a CVD process, a PVD process, an ALD process, and/or some other suitable deposition or growth process.

Figure 16:
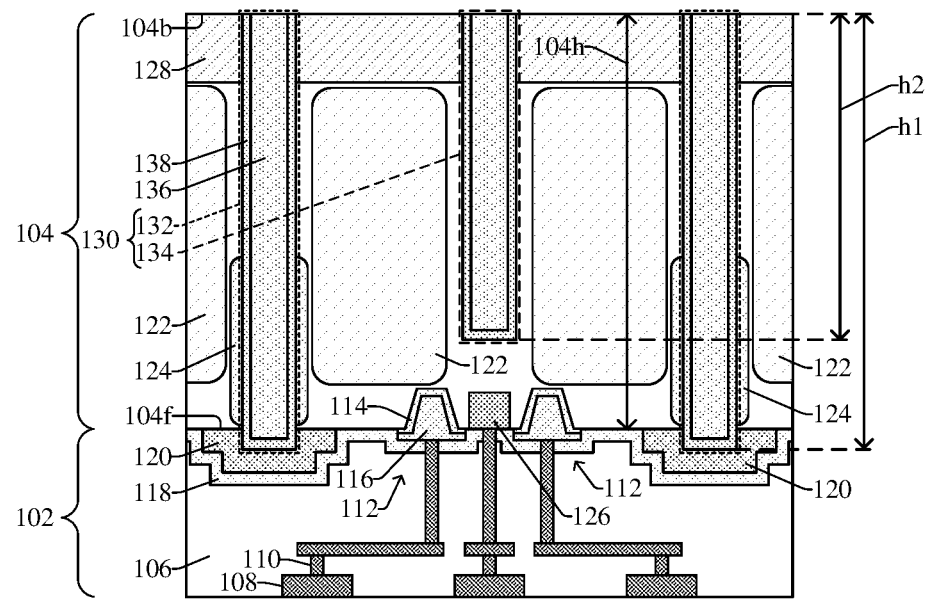

As illustrated in cross-sectional view 1600 of FIG. 16, a planarization process is performed on the trench fill layer 136 and the liner layer 138, thereby forming an isolation structure 130 comprising an outer isolation structure 132 and an inner isolation structure 134. In various embodiments, the planarization process comprises a CMP process, an etch process (e.g., a dry etch and/or a wet etch), or some other suitable process. The outer isolation structure 132 has the first height h1 and laterally encloses the plurality of photodetectors 122. Further, the inner isolation structure 134 has the second height h2 and is disposed between adjacent photodetectors in the plurality of photodetectors 122. In some embodiments, the outer isolation structure 132 is ring-shaped when viewed from above and the inner isolation structure 134 is cross-shaped when viewed from above (e.g., as illustrated and/or described in FIG. 2A or 2B). In yet further embodiments, the planarization process is performed such that top surfaces of the outer isolation structure 132 and the inner isolation structure 134 are co-planar with the back-side surface 104b of the substrate 104.

Figure 17:
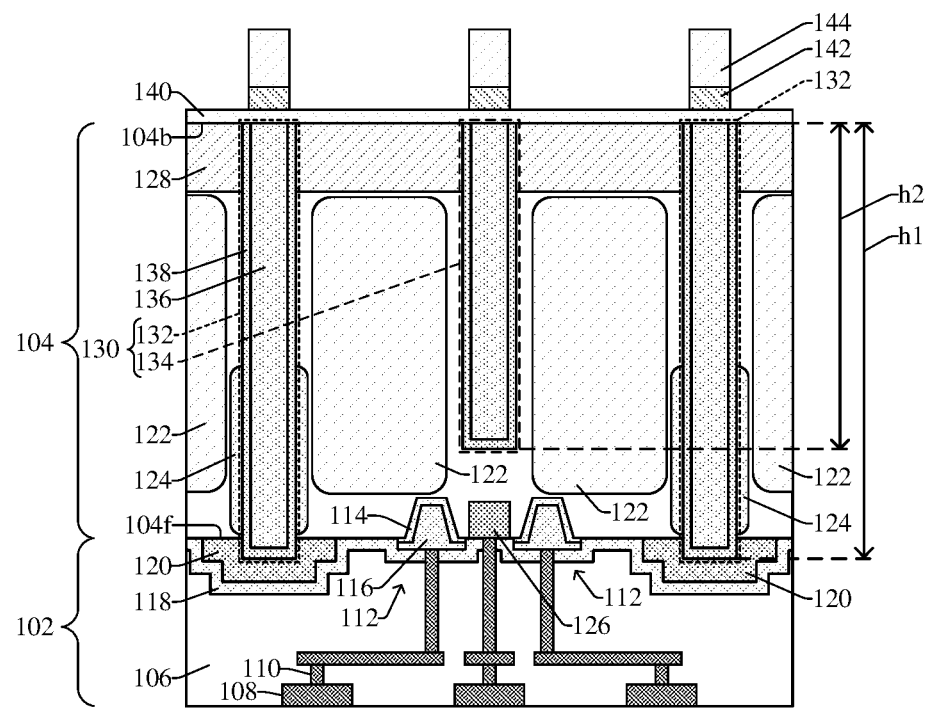

As illustrated in cross-sectional view 1700 of FIG. 17, an upper dielectric layer 140 is formed over the back-side surface 104b of the substrate. In addition, a conductive grid structure 142 is formed over the upper dielectric layer 140 and a dielectric grid structure 144 is formed over the conductive grid structure 142. In some embodiments, the upper dielectric layer 140 is formed by a PVD process, a CVD process, an ALD process, or some other suitable growth or deposition process. The upper dielectric layer 140 may, for example, be or comprise an oxide, such as silicon dioxide, or the like. In some embodiments, a process for forming the conductive grid structure 142 and the dielectric grid structure 144 comprises: depositing (e.g., by PVD, CVD, ALD, electroplating, electroless plating, etc.) a metal grid layer over the upper dielectric layer 140; depositing (e.g., by PVD, CVD, ALD, etc.) a dielectric grid layer on the metal grid layer; forming a masking layer (not shown) over the dielectric grid layer; patterning the metal grid layer and the dielectric grid layer according to the masking layer; and performing a removal process to remove the masking layer.

Figure 18:
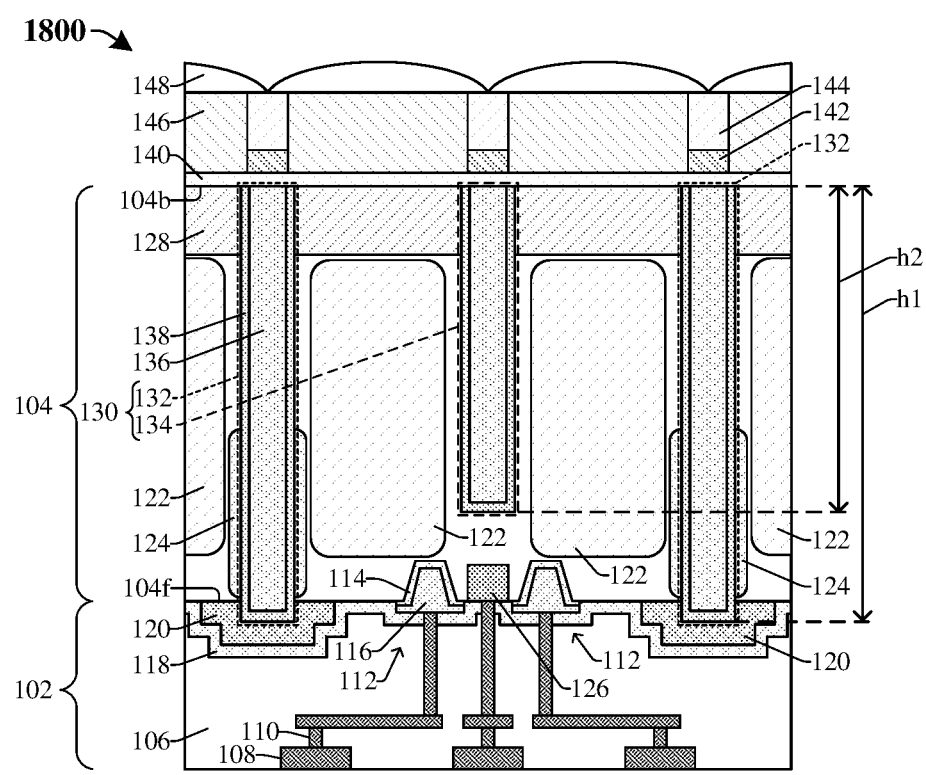

As illustrated in cross-sectional view 1800 of FIG. 18, a plurality of light filters 146 is formed over the plurality of photodetectors 122 and a plurality of micro-lenses 148 is formed over the plurality of light filters 146. In some embodiments, the light filters 146 and the micro-lenses 148 may be deposited by, for example, CVD, PVD, ALD, or some other suitable deposition or growth process.

Figure 19:
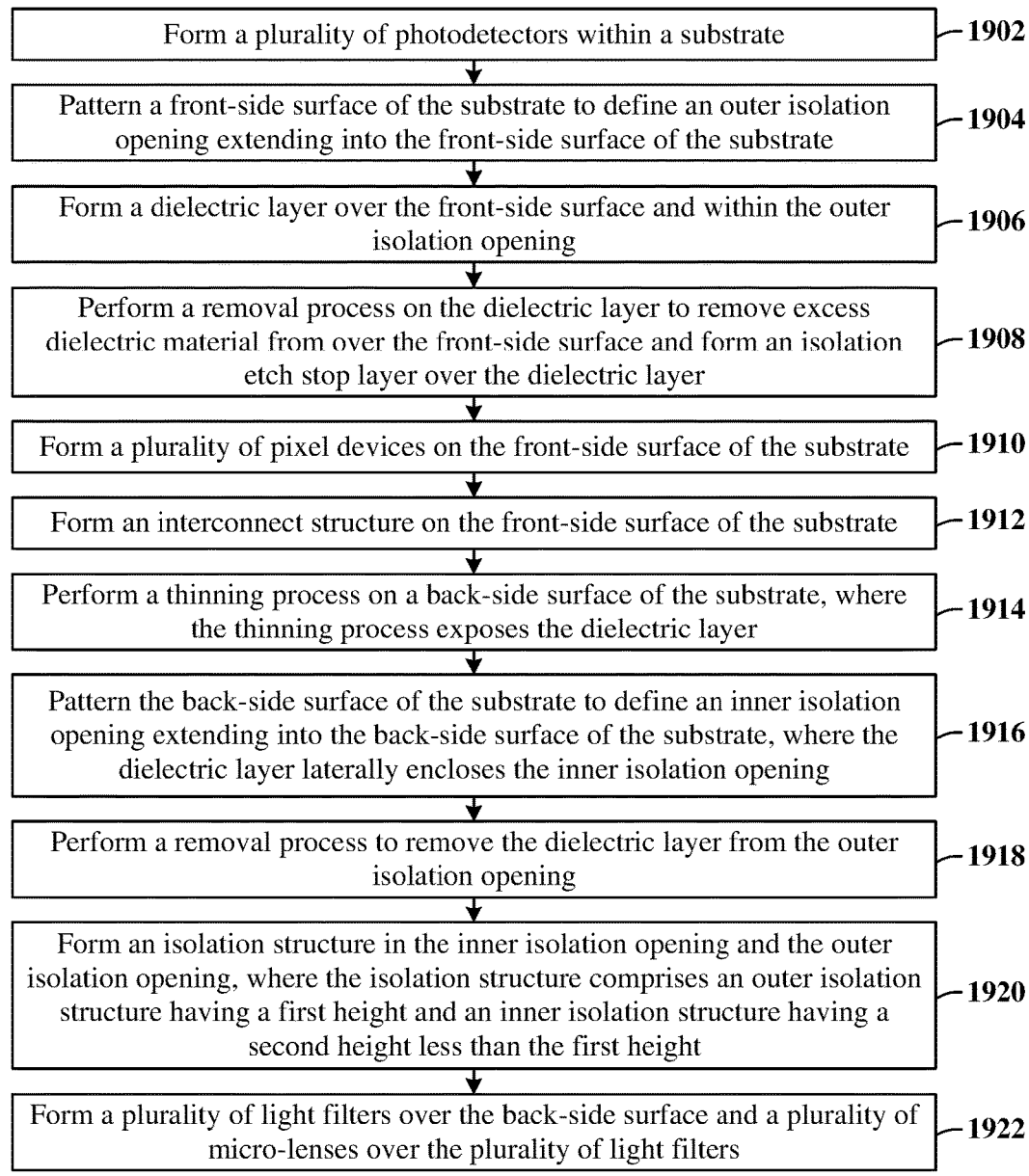
FIG. 19 illustrates a flowchart according to some embodiments of a method for forming an image sensor comprising an isolation structure having an outer isolation structure and an inner isolation structure that have different heights.

FIG. 19 illustrates some embodiments of a method 1900 of forming an image sensor comprising an isolation structure having an outer isolation structure and an inner isolation structure that have different heights according to the present disclosure. Although the method 1900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1902, a plurality of photodetectors is formed within a substrate. FIG. 5 illustrates a cross-sectional view 500 corresponding to some embodiments of act 1902.

At act 1904, a front-side surface of the substrate is patterned to define an outer isolation opening extending into the front-side surface of the substrate. FIG. 6 illustrates a cross-sectional view 600 corresponding to some embodiments of act 1904.

At act 1906, a dielectric layer is formed over the front-side surface and within the outer isolation opening. FIG. 7 illustrates a cross-sectional view 700 corresponding to some embodiments of act 1906.

At act 1908, a removal process is performed on the dielectric layer to remove excess dielectric material from over the front-side surface and an isolation etch stop layer is formed over the dielectric layer. FIG. 8A illustrates a cross-sectional view 800a corresponding to some embodiments of act 1908. FIGS. 8B through 8D illustrate cross-sectional views 1100b-1100d corresponding to various alternative embodiments of act 1908.

At act 1910, a plurality of pixel devices is formed on the front-side surface of the substrate. FIG. 9 illustrates a cross-sectional view 900 corresponding to some embodiments of act 1910.

At act 1912, an interconnect structure is formed on the front-side surface of the substrate. FIG. 11 illustrates a cross-sectional view 1100 corresponding to some embodiments of act 1912.

At act 1914, a thinning process is performed on a back-side surface of the substrate, where the thinning process exposes the dielectric layer. FIG. 12 illustrates a cross-sectional view 1200 corresponding to some embodiments of act 1914.

At act 1916, the back-side surface of the substrate is patterned to define an inner isolation opening extending into the back-side surface of the substrate, where the dielectric layer laterally encloses the inner isolation opening. FIG. 13 illustrates a cross-sectional view 1300 corresponding to some embodiments of act 1916.

At act 1918, a removal process is performed to remove the dielectric layer from the outer isolation opening. FIG. 14 illustrates a cross-sectional view 1400 corresponding to some embodiments of act 1918.

At act 1920, an isolation structure is formed in the inner isolation opening and the outer isolation opening, where the isolation structure comprises an outer isolation structure having a first height and an inner isolation structure having a second height that is less than the first height. FIGS. 15 and 16 illustrate cross-sectional views 1500 and 1600 corresponding to some embodiments of act 1920.

At act 1922, a plurality of light filters is formed over the back-side surface and a plurality of micro-lenses is formed over the plurality of light filters. FIG. 18 illustrates a cross-sectional view 1800 corresponding to some embodiments of act 1922.

Accordingly, in some embodiments, the present disclosure relates to an image sensor comprising an isolation structure that comprises an inner isolation structure disposed between adjacent photodetectors in a plurality of photodetectors and an outer isolation structure laterally enclosing the inner isolation structure, where the outer isolation structure has a first height and the inner isolation structure has a second height that is less than the first height.

In some embodiments, the present application provides an image sensor including: a plurality of photodetectors disposed within a substrate, wherein the substrate comprises a front-side surface opposite a back-side surface; an outer isolation structure disposed in the substrate and laterally surrounding the plurality of photodetectors, wherein the outer isolation structure has a first height; and an inner isolation structure spaced between sidewalls of the outer isolation structure, wherein the inner isolation structure is disposed between adjacent photodetectors in the plurality of photodetectors, wherein the outer isolation structure and the inner isolation structure respectively extend from the back-side surface toward the front-side surface, and wherein the inner isolation structure comprises a second height less than the first height. In an embodiment, the first height is greater than a third height of the substrate and the second height is less than the third height. In an embodiment, when viewed from above the outer isolation structure has a ring-shape and the inner isolation structure has a cross-shape. In an embodiment, the inner isolation structure and the outer isolation structure comprise a liner layer and a trench fill layer, wherein the liner layer is disposed between the trench fill layer and the substrate. In an embodiment, the image sensor further comprises an isolation etch stop layer directly contacting a bottom surface of the outer isolation structure. In an embodiment, the isolation etch stop layer extends from the front-side surface of the substrate to opposing sidewalls of the outer isolation structure. In an embodiment, the isolation etch stop layer underlies the front-side surface of the substrate and has a top surface vertically above the front-side surface. In an embodiment, the image sensor further comprises a floating diffusion node disposed in the substrate and underlying the plurality of photodetectors, wherein the floating diffusion node directly underlies the inner isolation structure.

In some embodiments, the present application provides an image sensor including: a plurality of photodetectors disposed within a substrate, wherein the substrate comprises a front-side surface opposite a back-side surface; a plurality of pixel devices disposed on the front-side surface of the substrate and underlying the plurality of photodetectors; and an isolation structure disposed in the substrate, wherein the isolation structure comprises an outer isolation structure surrounding the plurality of photodetectors and an inner isolation structure separating the photodetectors from one another, wherein the pixel devices are disposed between opposing sidewalls of the outer isolation structure, wherein the outer isolation structure and the inner isolation structure respectively extend from the back-side surface toward the front-side surface, and wherein a depth of the inner isolation structure is smaller than a depth of the outer isolation structure. In an embodiment, when viewed from above the outer isolation structure has a first shape and the inner isolation structure has a second shape different from the first shape. In an embodiment, the inner isolation structure directly contacts the outer isolation structure. In an embodiment, the image sensor further comprises an isolation etch stop layer disposed along a bottom surface of the outer isolation structure, wherein the isolation etch stop layer comprises a material different from that of the isolation structure. In an embodiment, the isolation etch stop layer and the outer isolation structure are ring-shaped when viewed from above. In an embodiment, a bottom surface of the inner isolation structure is disposed between a top and a bottom of the plurality of photodetectors, wherein a bottom surface of the outer isolation structure is disposed below the bottom of the plurality of photodetectors. In an embodiment, the image sensor further comprises an interconnect structure disposed on the front-side surface of the substrate, wherein the interconnect structure comprises a plurality of conductive wires and a plurality of conductive vias disposed within an interconnect dielectric structure, wherein a bottom surface of the outer isolation structure is disposed below a top surface of the interconnect structure.

In some embodiments, the present application provides a method for forming an image sensor, the method includes:

forming a plurality of photodetectors within a substrate, wherein the substrate comprises a front-side surface opposite a back-side surface; performing a first patterning process on the front-side surface of the substrate to define an outer isolation opening extending into the front-side surface and surrounding the plurality of photodetectors; forming a dielectric layer within the outer isolation opening; forming an isolation etch stop layer on the dielectric layer; performing a thinning process into the back-side surface of the substrate, wherein the thinning process exposes the dielectric layer; performing a second patterning process on the back-side surface of the substrate to define an inner isolation opening extending into the back-side surface, wherein the inner isolation opening separates the photodetectors from one another; performing a removal process to remove the dielectric layer from the outer isolation opening; forming an outer isolation structure within the outer isolation opening, wherein the outer isolation structure has a first height; and forming an inner isolation structure within the inner isolation opening, wherein the inner isolation structure has a second height less than the first height. In an embodiment, the outer isolation structure and the inner isolation structure are formed concurrently with one another. In an embodiment, the method further includes forming an interconnect structure on the front-side surface of the substrate, wherein the interconnect structure is formed after performing the first patterning process and before performing the second patterning process. In an embodiment, the removal process exposes an upper surface of the isolation etch stop layer. In an embodiment, when viewed from above the outer isolation structure and the isolation etch stop layer are ring-shaped and the inner isolation structure is cross-shaped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   forming a plurality of photodetectors within a substrate, wherein the substrate comprises a front-side surface opposite a back-side surface;
   performing a first patterning process on the front-side surface of the substrate to define an outer isolation opening extending into the front-side surface and surrounding the plurality of photodetectors;
   forming a dielectric layer within the outer isolation opening;
   forming an isolation etch stop layer on the dielectric layer;
   performing a thinning process into the back-side surface of the substrate, wherein the thinning process exposes the dielectric layer;
   performing a second patterning process on the back-side surface of the substrate to define an inner isolation opening extending into the back-side surface, wherein the inner isolation opening separates the photodetectors from one another;
   performing a removal process to remove the dielectric layer from the outer isolation opening;
   forming an outer isolation structure within the outer isolation opening, wherein the outer isolation structure has a first height; and
   forming an inner isolation structure within the inner isolation opening, wherein the inner isolation structure has a second height less than the first height.

2. The method of claim 1, wherein the outer isolation structure and the inner isolation structure are formed concurrently with one another.

3. The method of claim 2, further comprising:
   forming an interconnect structure on the front-side surface of the substrate, wherein the interconnect structure is formed after performing the first patterning process and before performing the second patterning process.

4. The method of claim 1, wherein the removal process exposes an upper surface of the isolation etch stop layer.

5. The method of claim 1, wherein when viewed from above the outer isolation structure and the isolation etch stop layer are ring-shaped and the inner isolation structure is cross-shaped.

6. The method of claim 1, wherein a third height of the substrate is less than the first height and is greater than the second height.

7. The method of claim 1, further comprising:
   performing an etching process on the dielectric layer before forming the isolation etch stop layer, wherein the dielectric layer comprises a lateral surface that is vertically offset from the front-side surface in a direction away from the substrate, wherein the isolation etch stop layer contacts opposing sidewalls of the dielectric layer and the lateral surface.

8. A method for forming an integrated chip, the method comprising:
   forming a plurality of photodetectors in a substrate, wherein the substrate comprises a first surface and a second surface vertically offset from the first surface;
   forming a first trench extending into the first surface of the substrate and around the plurality of photodetectors, wherein the first trench has a first depth;
   forming a plurality of pixel devices on the first surface of the substrate, wherein the first trench is formed before forming the plurality of pixel devices;
   forming an interconnect structure on the first surface of the substrate;
   forming a second trench extending into the second surface of the substrate and between adjacent photodetectors in the plurality of photodetectors, wherein the second trench has a second depth less than the first depth, wherein the second trench is formed after forming the interconnect structure; and
   forming an isolation structure in the first trench and the second trench.

9. The method of claim 8, wherein the isolation structure comprises an outer isolation structure arranged in the first trench and an inner isolation structure arranged in the second trench, wherein the outer isolation structure has the first depth and continuously extends around the inner isolation structure in a closed path.

10. The method of claim 9, further comprising:
    forming an isolation etch stop layer on the first surface of the substrate, wherein the isolation etch stop layer directly contacts opposing sidewalls and a lateral surface of the outer isolation structure.

11. The method of claim 10, wherein when viewed in top view the isolation etch stop layer and the outer isolation structure are respectively ring-shaped.

12. The method of claim 10, further comprising:
depositing a contact etch stop layer over the first surface of the substrate, wherein the contact etch stop layer contacts sidewalls and a lateral surface of the isolation etch stop layer.

13. The method of claim 9, further comprising:
forming a grid structure over the second surface of the substrate, wherein the grid structure comprises an inner grid segment laterally aligned with the inner isolation structure and an outer grid segment laterally aligned with the outer isolation structure.

14. The method of claim 8, further comprising:
depositing a sacrificial layer over the first surface of the substrate and in the first trench before forming the plurality of pixel devices; and
performing an etching process on the sacrificial layer to remove the sacrificial layer from the first surface of the substrate.

15. The method of claim 14, further comprising:
performing a thinning process into the substrate until a lateral surface of the sacrificial layer is reached, wherein the lateral surface of the sacrificial layer is aligned with the second surface of the substrate; and
wherein the sacrificial layer remains in the first trench while forming the second trench and the sacrificial layer is removed from the first trench before forming the isolation structure.

16. The method of claim 8, wherein forming the isolation structure comprises:
depositing a liner layer over the second surface of the substrate and lining the first trench and the second trench;
depositing a trench fill layer over the liner layer and filling remaining portions of the first trench and the second trench; and
performing a planarization process on the liner layer and the trench fill layer.

17. A method for forming an integrated chip, the method comprising:
doping a substrate to form a plurality of photodetectors in the substrate, wherein the substrate comprises a first surface and a second surface opposite the first surface;
forming a first etch stop layer on the first surface of the substrate;
doping the first surface of the substrate to form a floating diffusion node in the substrate and between at least two photodetectors in the plurality of photodetectors;
forming an outer isolation structure in a first trench disposed in the substrate, wherein the outer isolation structure has a first depth and laterally encloses the plurality of photodetectors, wherein the outer isolation structure contacts the first etch stop layer; and
forming an inner isolation structure in a second trench disposed in the substrate and spaced between opposing sidewalls of the outer isolation structure, wherein the inner isolation structure has a second depth less than the first depth, wherein at least a segment of the inner isolation structure is laterally aligned with the floating diffusion node.

18. The method of claim 17, wherein forming the first trench includes performing a first patterning process on the first surface of the substrate and forming the second trench includes performing a second patterning process on the second surface of the substrate.

19. The method of claim 18, wherein the first patterning process is performed before forming the floating diffusion node and the second patterning process is performed after forming the floating diffusion node.

20. The method of claim 18, wherein the first etch stop layer is formed over the first trench after performing the first patterning process.

* * * * *